United States Patent
Kang

(10) Patent No.: US 9,368,234 B2
(45) Date of Patent: Jun. 14, 2016

(54) NONVOLATILE MEMORY DEVICE AND METHOD OF OPERATING THE SAME

(71) Applicant: Kyoung-Tae Kang, Seoul (KR)

(72) Inventor: Kyoung-Tae Kang, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/594,759

(22) Filed: Jan. 12, 2015

(65) Prior Publication Data

US 2015/0270010 A1    Sep. 24, 2015

(30) Foreign Application Priority Data

Mar. 21, 2014  (KR) .................. 10-2014-0033107

(51) Int. Cl.
| | | |
|---|---|---|
| G11C 16/06 | (2006.01) | |
| G11C 29/12 | (2006.01) | |
| G11C 29/02 | (2006.01) | |
| G11C 29/50 | (2006.01) | |
| G11C 16/26 | (2006.01) | |
| G11C 16/04 | (2006.01) | |

(52) U.S. Cl.
CPC .......... *G11C 29/1201* (2013.01); *G11C 29/022* (2013.01); *G11C 29/028* (2013.01); *G11C 29/50008* (2013.01); *G11C 16/0416* (2013.01); *G11C 16/0483* (2013.01); *G11C 16/26* (2013.01)

(58) Field of Classification Search
CPC ............. G11C 2207/2254; G11C 7/22; G11C 11/4072; G11C 5/14; G11C 5/148; G11C 11/4078
See application file for complete search history.

(56) References Cited

U.S. PATENT DOCUMENTS

| | | | |
|---|---|---|---|
| 6,188,237 B1 | 2/2001 | Suzuki et al. | |
| 7,528,626 B2 | 5/2009 | Kim | |
| 8,461,867 B2 | 6/2013 | Kuwahara et al. | |
| 8,610,458 B2 | 12/2013 | Lee | |
| 2011/0066798 A1 | 3/2011 | Kaiwa et al. | |
| 2011/0102073 A1* | 5/2011 | Riho .................. | H03K 19/0005 327/541 |
| 2011/0115509 A1* | 5/2011 | Kim ................. | G01R 31/31717 324/750.3 |
| 2011/0193590 A1* | 8/2011 | Nakagawa ........... | G11C 7/1051 326/30 |
| 2012/0212272 A1 | 8/2012 | Yokou et al. | |

FOREIGN PATENT DOCUMENTS

| | | |
|---|---|---|
| JP | 3448231 B | 7/2003 |
| JP | 3640800 B | 1/2005 |
| JP | 2011182378 | 9/2011 |
| JP | 2013029448 | 2/2013 |
| KR | 101020299 B1 | 3/2011 |
| KR | 1020120099908 A | 9/2012 |
| KR | 1020130050818 A | 5/2013 |

* cited by examiner

*Primary Examiner* — Son Dinh
*Assistant Examiner* — Uyen B Tran
(74) *Attorney, Agent, or Firm* — Volentine & Whitt, PLLC

(57) ABSTRACT

In a method of operating a nonvolatile memory device, an impedance calibration verifying operation is performed based on a data read command. The impedance calibration verifying operation ascertains whether an impedance calibration operation is normally performed for a data input/output (I/O) terminal of the nonvolatile memory device. A detection value is stored in a storage unit. The detection value indicates a result of the impedance calibration verifying operation. The detection value is output based on a first command received after the nonvolatile memory device receives the data read command. A data read operation or the impedance calibration operation is selectively performed based on the detection value.

20 Claims, 17 Drawing Sheets

823c

NONVOLATILE MEMORY DEVICE AND METHOD OF OPERATING THE SAME

CROSS-REFERENCE TO RELATED APPLICATION

This application claims priority under 35 USC §119 to Korean Patent Application No. 2014-0033107, filed on Mar. 21, 2014 in the Korean Intellectual Property Office (KIPO), the contents of which are herein incorporated by reference in their entirety.

BACKGROUND

1. Technical Field

Example embodiments relate generally to semiconductor memory devices, and to methods of operating nonvolatile memory devices.

2. Description of the Related Art

As the operating speed of a semiconductor memory device has increased, swing widths of signals interfaced between the semiconductor memory device and a memory controller have decreased. A reason for the decrease of the swing widths is to minimize the time required to transmit the signals. However, as the swing widths have decreased, the signals transferred between the semiconductor memory device and the memory controller may be more easily distorted by impedance mismatches caused by process, voltage and temperature (PVT) variations. An impedance calibration operation for adjusting an output impedance and/or a termination impedance of the semiconductor memory device can be employed at transmitting and/or receiving stages of the semiconductor memory device. In the impedance calibration operation, the output impedance and/or the termination impedance may be adjusted by comparing the output impedance and/or the termination impedance with an impedance of an external resistor. The impedance calibration operation may be referred to as an input/output (I/O) offset cancellation operation or a ZQ calibration operation.

SUMMARY

Accordingly, the inventive concept is provided to substantially obviate one or more problems due to limitations and disadvantages of the related art.

Some example embodiments provide a method of operating a nonvolatile memory device capable of efficiently verifying whether an impedance calibration operation is normally performed.

Some example embodiments provide a nonvolatile memory device capable of efficiently verifying whether an impedance calibration operation is normally performed.

According to example embodiments, in a method of operating a nonvolatile memory device, an impedance calibration verifying operation is performed based on a data read command. It is determined whether an impedance calibration operation is normally performed on a data input/output (I/O) terminal of the nonvolatile memory device based on the impedance calibration verifying operation. A detection value is stored in a storage unit. The detection value indicates a result of the impedance calibration verifying operation. The detection value is output based on a first command received after the nonvolatile memory device receives the data read command. A data read operation or the impedance calibration operation is selectively performed based on the detection value.

Performing the impedance calibration verifying operation, storing the detection value, outputting the detection value and selectively performing the data read operation or the impedance calibration operation may be repeated after the impedance calibration operation is performed based on the detection value and the second value.

According to example embodiments, a method of operating a nonvolatile memory device includes: performing an impedance calibration verifying operation for a data input/output (I/O) terminal of the nonvolatile memory device based on one of a data read command and an impedance calibration command for the data I/O terminal of the nonvolatile memory device, wherein the impedance calibration verifying operation ascertains whether an impedance calibration operation is normally performed for the data I/O terminal of the nonvolatile memory device; producing a detection value indicating a result of the impedance calibration verifying operation; and selectively performing a data read operation or the impedance calibration operation based on the detection value.

In an example embodiment, in selectively performing the data read operation or the impedance calibration operation, the data read operation may be performed based on the data read command when the detection value is substantially the same as a first value. The first value may indicate that the impedance calibration operation is normally performed. The impedance calibration operation may be performed based on an impedance calibration command when the detection value is substantially the same as a second value. The second value may indicate that the impedance calibration operation is abnormally performed.

In an example embodiment, the method also includes outputting the detection value based on a first command received after the nonvolatile memory device receives the one of the data read command and the impedance calibration command.

In an example embodiment, the detection value may be output through the data I/O terminal of the nonvolatile memory device.

In an example embodiment, the impedance calibration verifying operation may be performed after the nonvolatile memory device receives the data read command and while the nonvolatile memory device has a busy status.

In an example embodiment, the impedance calibration verifying operation may be performed after the nonvolatile memory device receives the data read command, after a status of the nonvolatile memory device is changed from a busy status to a ready status and before the nonvolatile memory device receives the first command.

In an example embodiment, the impedance calibration operation may include a pull-up impedance calibration operation and a pull-down impedance calibration operation. The impedance calibration verifying operation may include a first verifying operation for the pull-up impedance calibration operation and a second verifying operation for the pull-down impedance calibration operation.

In an example embodiment, in performing the impedance calibration verifying operation, a first verifying operation may be performed based on a pull-up voltage that is output from an impedance calibration circuit included in the nonvolatile memory device. A second verifying operation may be performed based on a pull-down voltage that is output from the impedance calibration circuit. The detection value may be generated based on results of the first and second verifying operations.

In an example embodiment, in performing the first verifying operation, a first comparison signal may be generated by comparing the pull-up voltage with a first reference voltage. A second comparison signal may be generated by comparing the pull-up voltage with a second reference voltage. A first detection signal may be generated based on the first and second comparison signals.

In an example embodiment, in performing the second verifying operation, a third comparison signal may be generated by comparing the pull-down voltage with the first reference voltage. A fourth comparison signal may be generated by comparing the pull-down voltage with the second reference voltage. A second detection signal may be generated based on the third and fourth comparison signals.

In an example embodiment, the nonvolatile memory device may include an impedance calibration circuit and a pass/fail detection circuit. The impedance calibration circuit may perform the impedance calibration operation. The pass/fail detection circuit may perform the impedance calibration verifying operation.

In an example embodiment, the method also includes performing an impedance calibration operation for the data I/O terminal of the nonvolatile memory device in response to the impedance calibration command, prior to performing the impedance calibration verifying operation.

According to example embodiments, in a method of operating a nonvolatile memory device, an impedance calibration operation is performed on a data input/output (I/O) terminal of the nonvolatile memory device based on an impedance calibration command. An impedance calibration verifying operation is performed. It is determined whether the impedance calibration operation is normally performed based on the impedance calibration verifying operation. A detection value is stored in a storage unit. The detection value indicates a result of the impedance calibration verifying operation. The detection value is output based on a first command received after the nonvolatile memory device receives the data read command. The impedance calibration operation is selectively re-performed based on the detection value.

In an example embodiment, in selectively re-performing the impedance calibration operation, an operation of the nonvolatile memory device associated with the impedance calibration operation may be terminated when the detection value is substantially the same as a first value. The first value may indicate that the impedance calibration operation is normally performed. The impedance calibration operation may be re-performed based on the impedance calibration command when the detection value is substantially the same as a second value. The second value may indicate that the impedance calibration operation is abnormally performed.

According to example embodiments, a nonvolatile memory device includes an impedance calibration circuit, a pass/fail detection circuit and a storage unit. The impedance calibration circuit performs an impedance calibration operation on a data input/output (I/O) terminal of the nonvolatile memory device based on an impedance calibration command. The pass/fail detection circuit performs an impedance calibration verifying operation based on a data read command or the impedance calibration command. The impedance calibration verifying operation ascertains whether the impedance calibration operation is normally performed for the data I/O terminal of the nonvolatile memory device. The storage unit is configured to store a detection value. The detection value indicates a result of the impedance calibration verifying operation and is output from the storage unit based on a first command received after the nonvolatile memory device receives the data read command or the impedance calibration command. The impedance calibration operation is selectively performed based on the detection value.

In an example embodiment, the nonvolatile memory device may further include a memory core storing data. A data read operation from the memory core or the impedance calibration operation may be selectively performed based on the detection value when the detection value is generated based on the impedance calibration verifying operation.

In an example embodiment, the impedance calibration operation may be selectively re-performed based on the detection value when the impedance calibration operation is performed and when the detection value is generated based on the impedance calibration verifying operation.

In an example embodiment, the pass/fail detection circuit may include a first verification unit and a second verification unit. The first verification unit may generate a first detection signal based on a first reference voltage, a second reference voltage and a pull-up voltage output from the impedance calibration circuit. The second verification unit may generate a second detection signal based on the first reference voltage, the second reference voltage and a pull-down voltage output from the impedance calibration circuit. The detection value may be stored in the storage unit based on the first and second detection signals.

In an example embodiment, the first verification unit may include a first comparison unit, a second comparison unit and a first detection signal generation unit. The first comparison unit may generate a first comparison signal by comparing the pull-up voltage with the first reference voltage based on a verification enable signal. The second comparison unit may generate a second comparison signal by comparing the pull-up voltage with the second reference voltage based on the verification enable signal. The first detection signal generation unit may generate the first detection signal based on the verification enable signal and the first and second comparison signals.

In an example embodiment, the second verification unit may include a third comparison unit, a fourth comparison unit and a second detection signal generation unit. The third comparison unit may generate a third comparison signal by comparing the pull-down voltage with the first reference voltage based on the verification enable signal. The fourth comparison unit may generate a fourth comparison signal by comparing the pull-down voltage with the second reference voltage based on the verification enable signal. The second detection signal generation unit may generate the second detection signal based on the verification enable signal and the third and fourth comparison signals.

In an example embodiment, the pass/fail detection circuit may further include a reference voltage generation unit. The reference voltage generation unit may generate the first and second reference voltages based on a power supply voltage, a ground voltage and the verification enable signal.

According to example embodiments, a method includes: receiving at a memory device a read command for reading data from one or more memory cells of the memory device; in response to the received read command, verifying whether an impedance calibration of a data input/output (I/O) terminal of the memory device is normal; when the impedance calibration of the data I/O terminal of the memory device is verified to be normal, performing the read command without first performing an impedance calibration operation for the data I/O terminal; and when the impedance calibration of the data I/O terminal of the memory device is not verified to be normal, performing an impedance calibration operation for the data I/O terminal.

In an example embodiment, verifying whether an impedance calibration of a data input/output (I/O) terminal of the memory device is normal includes producing a detection value which indicates whether or not the impedance calibration of the data I/O terminal of the memory device is verified to be normal, the method further comprising outputting the detection value from the memory device via the I/O terminal.

In an example embodiment, verifying whether an impedance calibration of a data input/output (I/O) terminal of the memory device is normal includes ascertaining whether a pull-up voltage and a pull-down voltage of an impedance calibration circuit of the memory device are within an impedance calibration range.

Accordingly, in the method of operating the nonvolatile memory device according to example embodiments, the impedance calibration verifying operation may be efficiently performed. For example, the impedance calibration verifying operation may be performed before the data read operation, and then the data read operation or the impedance calibration operation may be selectively performed based on the result of the impedance calibration verifying operation. For another example, the impedance calibration verifying operation may be performed after the impedance calibration operation, and then the impedance calibration operation may be selectively re-performed based on the result of the impedance calibration verifying operation. Accordingly, a command overhead of the nonvolatile memory device may be reduced and a data throughput of the nonvolatile memory device may be improved.

BRIEF DESCRIPTION OF THE DRAWINGS

Illustrative, non-limiting example embodiments will be more clearly understood from the following detailed description taken in conjunction with the accompanying drawings.

DETAILED DESCRIPTION OF THE EMBODIMENTS

Figure 1:
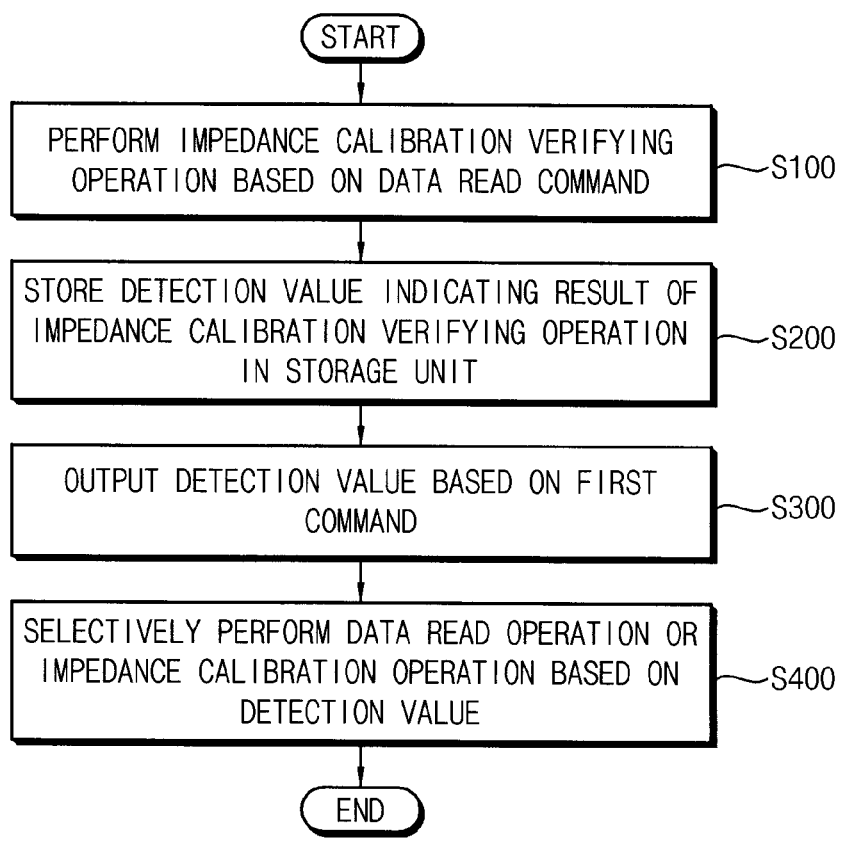
FIG. 1 is a flow chart illustrating a method of operating a nonvolatile memory device according to example embodiments.

Various example embodiments will be described more fully with reference to the accompanying drawings, in which embodiments are shown. This inventive concept may, however, be embodied in many different forms and should not be construed as limited to the embodiments set forth herein. Rather, these embodiments are provided so that this disclosure will be thorough and complete, and will fully convey the scope of the inventive concept to those skilled in the art. Like reference numerals refer to like elements throughout this application.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the inventive concept. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a flow chart illustrating a method of operating a nonvolatile memory device according to example embodiments.

Referring to FIG. 1, in a method of operating a nonvolatile memory device according to example embodiments, an impedance calibration verifying operation is performed based on a data read command (step S100). It is determined whether an impedance calibration operation is normally performed on a data input/output (I/O) terminal of the nonvolatile memory device based on the impedance calibration verifying operation. The impedance calibration operation may be an operation for adjusting an output impedance and/or a termination impedance (e.g., an impedance at the data I/O terminal) of the nonvolatile memory device. In the impedance calibration operation, the output impedance and/or the termination impedance may be adjusted by comparing the output impedance and/or the termination impedance with an impedance of an external resistor. The output impedance and/or the termination impedance may be fixed regardless of process, voltage and temperature (PVT) variations, based on the impedance calibration operation. Detailed examples of the step S100 will be described with reference to FIGS. 4, 6, 7 and 8.

A detection value is stored in a storage unit (step S200). The detection value indicates a result of the impedance calibration verifying operation. After the detection value is stored in the storage unit, the detection value is output from the storage unit based on a first command (step S300). The first command is a command received by the nonvolatile memory device after it receives the data read command.

A data read operation or the impedance calibration operation is selectively performed based on the detection value (step S400). For example, the data read operation may be performed when it is determined, based on the detection value, that the impedance calibration operation is normally performed. The impedance calibration operation may be performed when it is determined, based on the detection value, that the impedance calibration operation is abnormally performed. Detailed examples of step S400 will be described with reference to FIG. 10.

In the method of operating the nonvolatile memory device according to example embodiments, the impedance calibration verifying operation may be efficiently performed. For example, the impedance calibration operation may not always be performed before the data read operation. Instead, an impedance calibration verifying operation may be performed before the data read operation, and then the data read operation or the impedance calibration operation may be selectively performed based on the result of the impedance calibration verifying operation. The nonvolatile memory device operating based on the method may receive the impedance calibration command and may perform the impedance calibration operation only when the impedance calibration operation is required. Accordingly, a command overhead of the nonvolatile memory device may be reduced and a data throughput of the nonvolatile memory device may be improved.

Figure 2:
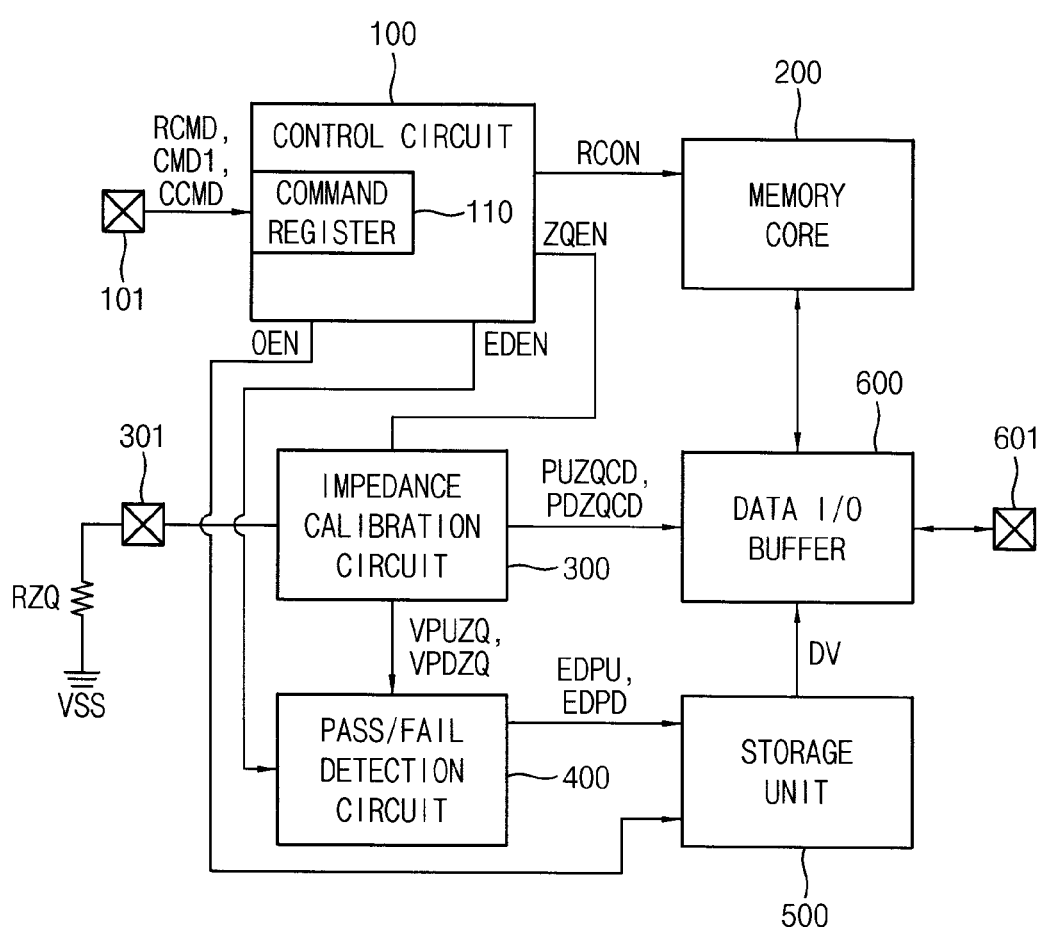
FIG. 2 is a block diagram illustrating a nonvolatile memory device according to example embodiments.

FIG. 2 is a block diagram illustrating a nonvolatile memory device 10 according to example embodiments.

Referring to FIG. 2, nonvolatile memory device 10 includes a control circuit 100, a memory core 200, an impedance calibration circuit 300, a pass/fail detection circuit 400, a storage unit 500 and a data I/O buffer 600.

In some example embodiments, nonvolatile memory device 10 may be implemented as a flash memory device. In other example embodiments, nonvolatile memory device 10 may be implemented as any nonvolatile memory device, e.g., a phase random access memory (PRAM), a ferroelectric random access memory (FRAM), a resistive random access memory (RRAM), a magnetic random access memory (MRAM), etc.

Control circuit 100 may control an operation of nonvolatile memory device 10. Control circuit 100 may generate control signals for nonvolatile memory device 10 based on commands that are received from an external memory controller (e.g., an element 810 in FIG. 15) through a command input terminal 101. Nonvolatile memory device 10 may perform various operations, e.g., a data read operation, a data write operation, a data erase operation, an impedance calibration operation, an impedance calibration verifying operation, etc., based on the control signals. For example, control circuit 100 may generate a read control signal RCON based on a received data read command RCMD, may generate an impedance calibration enable signal ZQEN based on a received impedance calibration command CCMD, may generate a verification enable signal EDEN based on the received data read command RCMD or the received impedance calibration command CCMD, and may generate an output enable signal OEN based on a received first command CMD1. Although not illustrated in FIG. 2, control circuit 100 may further generate a write control signal and an erase control signal based on a received data write command and a received data erase command, respectively.

Control circuit 100 may include a command register 110 that stores at least one selected from the commands RCMD, CMD1 and CCMD. Although FIG. 2 illustrates an example where command register 110 is located internal to control circuit 100, in some example embodiments, command register 110 may be located external to control circuit 100.

In some example embodiments, the data read command RCMD may have a value of about '00h,' and the first command CMD1 may have a value of about '70h.' The impedance calibration command CCMD may correspond to a ZQ calibration long (ZQCL) command that has a value of about 'F9h' or a ZQ calibration short (ZQCS) command that has a value of about 'D9h.'

Memory core 200 may store write data that is provided from the external memory controller based on the write control signal. Memory core 200 may output read data based on the read control signal RCON to provide the read data to the external memory controller. In addition, memory core 200 may erase data based on the erase control signal. As will be described with reference to FIG. 15, memory core 200 may include a memory cell array, a row decoder, a page buffer, etc.

Impedance calibration circuit 300 may perform the impedance calibration operation based on the impedance calibration enable signal ZQEN. For example, the impedance calibration operation may include a pull-up impedance calibration operation and a pull-down impedance calibration operation. The impedance calibration circuit 300 may generate a pull-up calibration code PUZQCD, a pull-down calibration code PDZQCD, a pull-up voltage VPUZQ and a pull-down voltage VPDZQ as a result of the impedance calibration operation.

Impedance calibration circuit 300 may be connected to an external resistor RZQ through a ZQ terminal 301. The external resistor RZQ may have a first terminal connected to ZQ terminal 301 and a second terminal connected to a ground voltage VSS.

Pass/fail detection circuit 400 may perform the impedance calibration verifying operation based on the verification enable signal EDEN, the pull-up voltage VPUZQ and the pull-down voltage VPDZQ. For example, the impedance calibration verifying operation may include a first verifying operation for the pull-up impedance calibration operation and a second verifying operation for the pull-down impedance calibration operation. Pass/fail detection circuit 400 may generate a first detection signal EDPU and a second detection signal EDPD as a result of the impedance calibration verifying operation.

Storage unit 500 may store a detection value DV indicating the result of the impedance calibration verifying operation based on the first detection signal EDPU and the second detection signal EDPD. Storage unit 500 may output the detection value DV based on the output enable signal OEN. For example, the detection value DV may be output to the external memory controller through data I/O buffer 600 and a data I/O terminal 601.

In some example embodiments, storage unit 500 may include a status register of nonvolatile memory device 10. In this case, the detection value DV may correspond to a status read value stored in the status register. Although FIG. 2 illustrates an example where storage unit 500 is an additional element in nonvolatile memory device 10, in some example embodiments, storage unit 500 may be located internal to control circuit 100 or may be located external to nonvolatile memory device 10.

Data I/O buffer 600 may provide the write data, which is received from the external memory controller through data I/O terminal 601, to memory core 200. The data I/O buffer 600 may provide the read data, which is output from memory core 200, to the external memory controller through data I/O terminal 601. In addition, data I/O buffer 600 may maintain an output impedance and/or a termination impedance (e.g., an impedance at data I/O terminal 601) of nonvolatile memory device 10 based on the pull-up calibration code PUZQCD and the pull-down calibration code PDZQCD. Although not illustrated in FIG. 2, data I/O buffer 600 may include a pull-up driving unit and a pull-down driving unit each of which adjusts the output impedance and/or the termination impedance based on one of the pull-up calibration code PUZQCD and the pull-down calibration code PDZQCD.

Although FIG. 2 illustrates an example where nonvolatile memory device 10 includes one data I/O buffer 600 and one data I/O terminal 601, in some example embodiments, nonvolatile memory device 10 may include a plurality of data I/O buffers and a plurality of data I/O terminals. In addition, although not illustrated in FIG. 2, nonvolatile memory device 10 may further include a voltage generator, an address buffer, etc.

Figure 3:
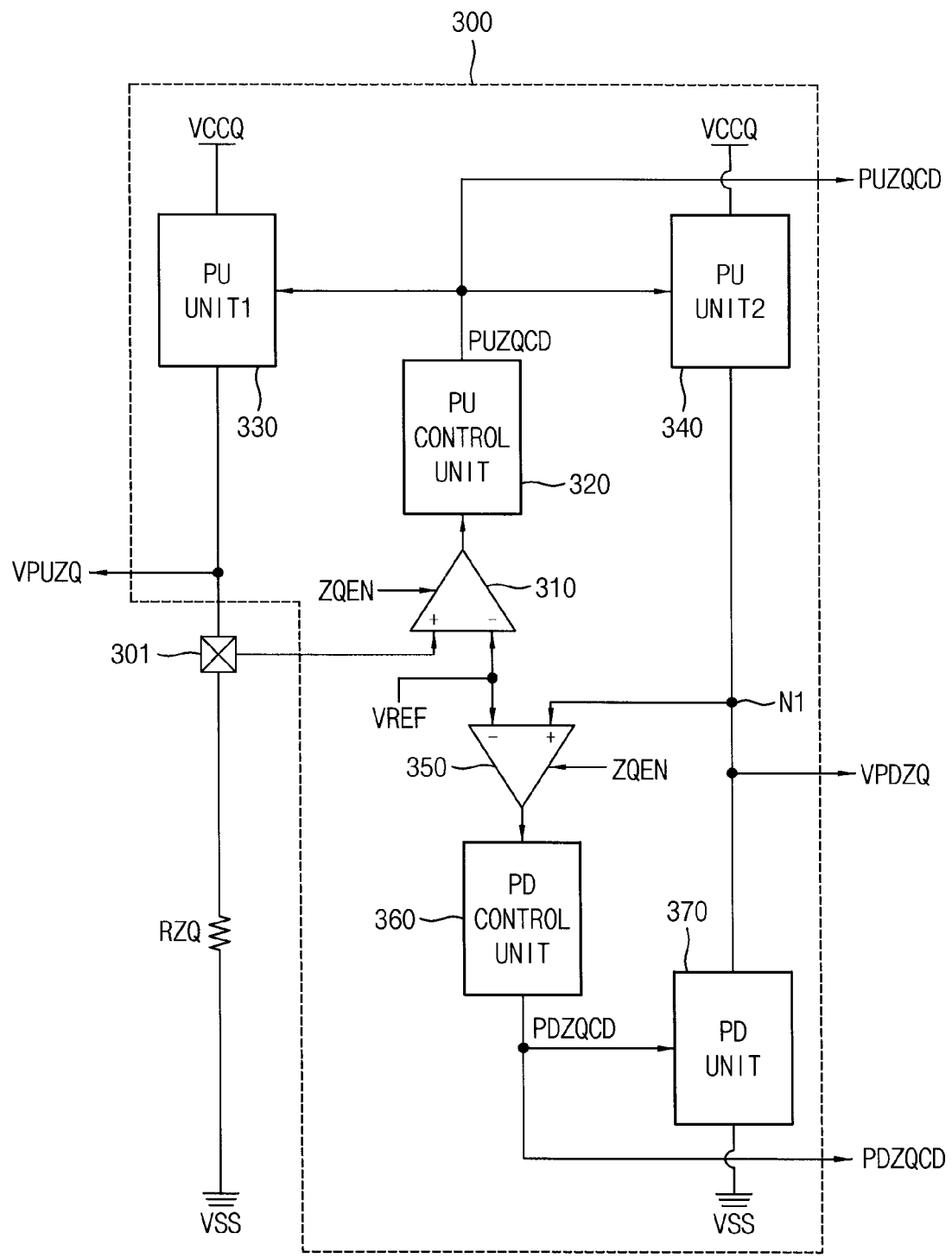
FIG. 3 is a diagram illustrating an example of an impedance calibration circuit included in the nonvolatile memory device of FIG. 2.

FIG. 3 is a diagram illustrating an example of an impedance calibration circuit included in the nonvolatile memory device of FIG. 2.

Referring to FIG. 3, impedance calibration circuit 300 may include a first comparison unit 310, a pull-up control unit 320, a first pull-up unit 330, a second pull-up unit 340, a second comparison unit 350, a pull-down control unit 360 and a pull-down unit 370.

First pull-up unit 330 may be connected between a power supply voltage VCCQ and ZQ terminal 301. The external resistor RZQ may be connected between ZQ terminal 301 and a ground voltage VSS. In other words, first pull-up unit 330 and the external resistor RZQ may be connected in serial between the power supply voltage VCCQ and the ground voltage VSS. Second pull-up unit 340 may be connected between the power supply voltage VCCQ and a first node N1. Pull-down unit 370 may be connected between the first node N1 and the ground voltage VSS. In other words, second pull-up unit 340 and pull-down unit 370 may be connected in series between the power supply voltage VCCQ and the ground voltage VSS.

First comparison unit 310 may compare a voltage at ZQ terminal 301 with a reference voltage VREF based on the impedance calibration enable signal ZQEN. For example, the reference voltage VREF may correspond to a half of the power supply voltage VCCQ (e.g., VCCQ/2).

Pull-up control unit 320 and first pull-up unit 330 may perform the pull-up impedance calibration operation based on an output of first comparison unit 310. For example, pull-up control unit 320 may control the pull-up calibration code PUZQCD based on the output of first comparison unit 310, and an impedance of first pull-up unit 330 may be adjusted based on the pull-up calibration code PUZQCD. The pull-up calibration code PUZQCD may be changed until the voltage at ZQ terminal 301 becomes substantially the same as the reference voltage VREF. When the voltage at ZQ terminal 301 is substantially the same as the reference voltage VREF, the pull-up control unit 320 may determine that the pull-up impedance calibration operation is completed. The pull-up calibration code PUZQCD where the voltage at ZQ terminal 301 is substantially the same as the reference voltage VREF may be output as a final pull-up calibration code. Pull-up control unit 320 may provide the final pull-up calibration code to second pull-up unit 340 and data I/O buffer 600 in FIG. 2.

Second pull-up unit 340 may have a configuration which is substantially the same as that of first pull-up unit 330. An impedance of second pull-up unit 340 may be adjusted based on the pull-up calibration code PUZQCD (e.g., the final pull-up calibration code). Thus, the impedance of second pull-up unit 340 may be substantially the same as the impedance of first pull-up unit 330.

Second comparison unit 350 may compare a voltage at the first node N1 with the reference voltage VREF based on the impedance calibration enable signal ZQEN.

Pull-down control unit 360 and pull-down unit 370 may perform the pull-down impedance calibration operation based on an output of second comparison unit 350. For example, pull-down control unit 360 may control the pull-down calibration code PDZQCD based on the output of second comparison unit 350, and an impedance of pull-down unit 370 may be adjusted based on the pull-down calibration code PDZQCD. The pull-down calibration code PDZQCD may be changed until when the voltage at the first node N1 becomes substantially the same as the reference voltage VREF. When the voltage at the first node N1 is substantially the same as the reference voltage VREF, pull-down control unit 360 may determine that the pull-down impedance calibration operation is completed. The pull-down calibration code PDZQCD where the voltage at the first node N1 is substantially the same as the reference voltage VREF may be output as a final pull-down calibration code. Pull-down control unit 360 may provide the final pull-down calibration code to data I/O buffer 600 in FIG. 2.

When the impedance calibration operation including the pull-up impedance calibration operation and the pull-down impedance calibration operation is completed, impedance calibration circuit 300 may output the pull-up calibration code PUZQCD, the pull-down calibration code PDZQCD, the pull-up voltage VPUZQ and the pull-down voltage VPDZQ. The pull-up voltage VPUZQ may correspond to the voltage at the ZQ terminal 301, and the -down voltage VPDZQ may correspond to the voltage at the first node N1.

Although not illustrated in FIG. 3, each of first pull-up unit 330, second pull-up unit 340 and pull-down unit 370 may include a plurality of transistors that are connected in parallel to each other and are selectively turned on based on the pull-up calibration code PUZQCD or the pull-down calibration code PDZQCD. According to example embodiments, each of first pull-up unit 330, second pull-up unit 340 and pull-down unit 370 may further include a plurality of resistors that are connected to the plurality of transistors. In addition, although not illustrated in FIG. 3, impedance calibration circuit 300 may further include a reference voltage generation unit that generates the reference voltage VREF.

Figure 4:
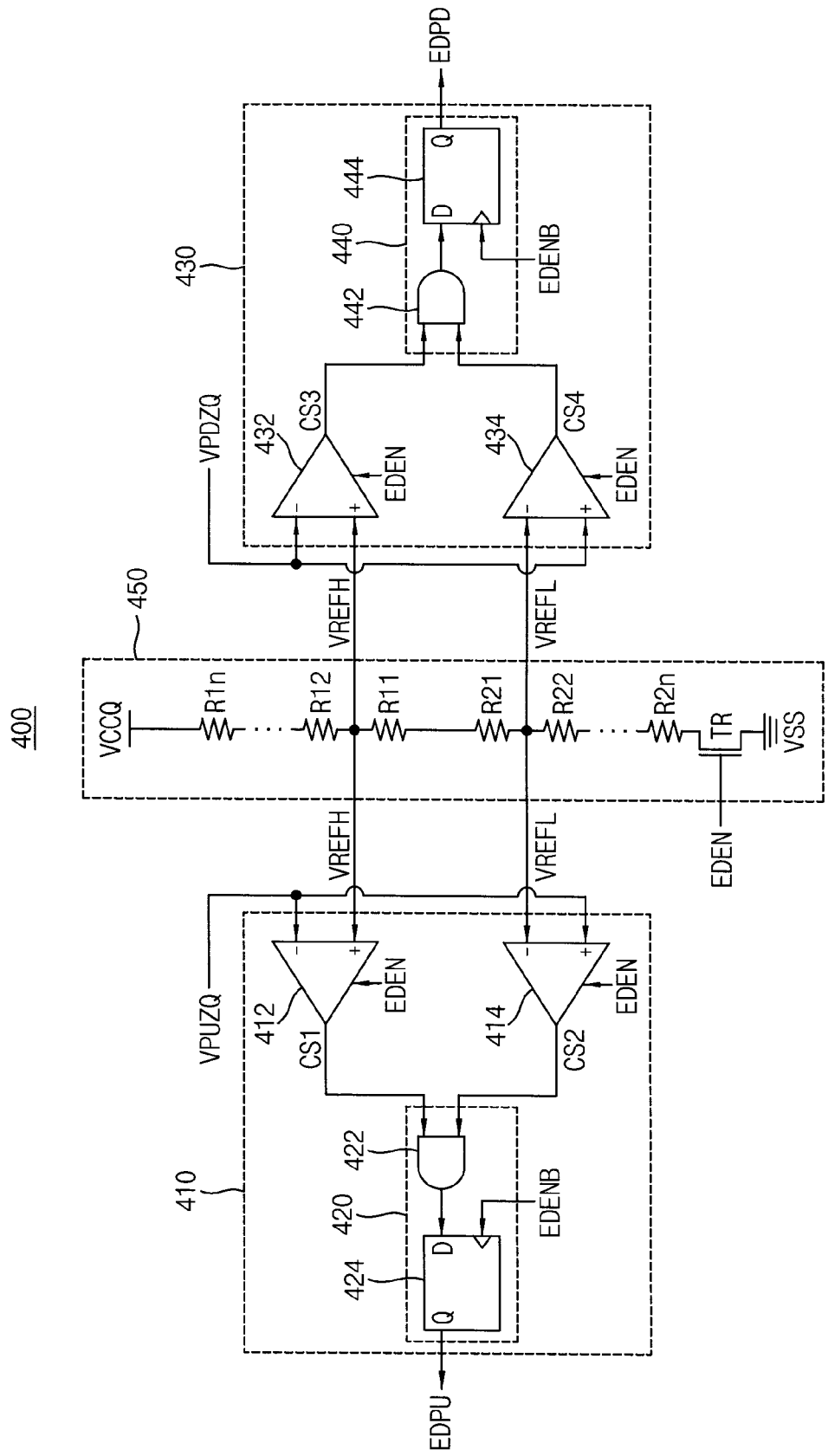
FIG. 4 is a diagram illustrating an example of a pass/fail detection circuit included in the nonvolatile memory device of FIG. 2.

FIG. 4 is a diagram illustrating an example of a pass/fail detection circuit included in the nonvolatile memory device of FIG. 2.

Referring to FIG. 4, pass/fail detection circuit 400 may include a first verification unit 410 and a second verification unit 430. Pass/fail detection circuit 400 may further include a reference voltage generation unit 450.

Reference voltage generation unit 450 may generate a first reference voltage VREFH and a second reference voltage VREFL based on the power supply voltage VCCQ, the ground voltage VSS and the verification enable signal EDEN. Reference voltage generation unit 450 may include a plurality of resistors R11, R12, ..., R1n, R21, R22, ..., R2n and a transistor TR. The plurality of resistors R11, ..., R2n and the transistor TR may be connected in serial between the power supply voltage VCCQ and the ground voltage VSS. The transistor TR may be selectively turned on based on the verification enable signal EDEN.

In some example embodiments, each of the first reference voltage VREFH and the second reference voltage VREFL may have a value corresponding to an accuracy of the impedance calibration verifying operation. For example, if the accuracy of the impedance calibration verifying operation is set to ±5%, a level of the first reference voltage VREFH may be higher than a level of the reference voltage VREF in FIG. 3 (e.g., VCCQ/2) by 5%, and a level of the second reference voltage VREFL may be lower than the level of the reference voltage VREF in FIG. 3 (e.g., VCCQ/2) by 5%. The levels of the first and second reference voltages VREFH and VREFL may be determined based on the number of the resistors R11, ..., R2n and resistances of the resistors R11, ..., R2n. The range between the first and second reference voltages VREFH and VREFL may define an impedance calibration range.

First verification unit 410 may perform the first verifying operation for the pull-up impedance calibration operation based on the pull-up voltage VPUZQ. For example, first verification unit 410 may generate a first detection signal EDPU based on the first reference voltage VREFH, the second reference voltage VREFL, the pull-up voltage VPUZQ and the verification enable signal EDEN. First verification unit 410 may include a first comparison unit 412, a second comparison unit 414 and a first detection signal generation unit 420.

First comparison unit 412 may generate a first comparison signal CS1 by comparing the pull-up voltage VPUZQ with the first reference voltage VREFH based on the verification enable signal EDEN. Second comparison unit 414 may generate a second comparison signal CS2 by comparing the pull-up voltage VPUZQ with the second reference voltage VREFL based on the verification enable signal EDEN.

First detection signal generation unit 420 may generate the first detection signal EDPU based on the verification enable signal EDEN and the first and second comparison signals CS1 and CS2. First detection signal generation unit 420 may include a first AND gate 422 and a first flip-flop 424. First AND gate 422 may perform an AND operation on the first comparison signal CS1 and the second comparison signal CS2. First flip-flop 424 may generate the first detection signal EDPU based on an output of first AND gate 422 and an inversion signal EDENB of the verification enable signal EDEN.

Second verification unit 430 may perform the second verifying operation for the pull-down impedance calibration operation based on the pull-down voltage VPDZQ. For example, second verification unit 430 may generate a second detection signal EDPD based on the first reference voltage VREFH, the second reference voltage VREFL, the pull-down voltage VPDZQ and the verification enable signal EDEN. Second verification unit 430 may include a third comparison unit 432, a fourth comparison unit 434 and a second detection signal generation unit 440.

Third comparison unit 432 may generate a third comparison signal CS3 by comparing the pull-down voltage VPDZQ with the first reference voltage VREFH based on the verification enable signal EDEN. Fourth comparison unit 434 may generate a fourth comparison signal CS4 by comparing the pull-down voltage VPDZQ with the second reference voltage VREFL based on the verification enable signal EDEN.

Second detection signal generation unit 440 may generate the second detection signal EDPD based on the verification enable signal EDEN and the third and fourth comparison signals CS3 and CS4. Second detection signal generation unit 440 may include a second AND gate 442 and a second flip-flop 444. Second AND gate 442 may perform the AND operation on the third comparison signal CS3 and the fourth comparison signal CS4. Second flip-flop 424 may generate the second detection signal EDPD based on an output of the second AND gate 442 and the inversion signal EDENB of the verification enable signal EDEN.

Figure 5:
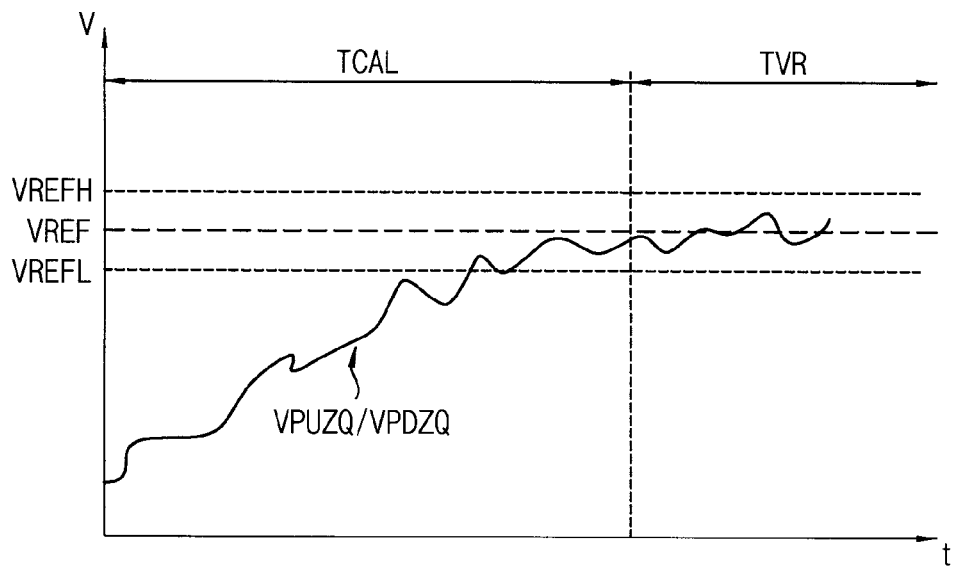
FIG. 5 is a diagram for describing operations of the impedance calibration circuit of FIG. 3 and the pass/fail detection circuit of FIG. 4.

FIG. 5 is a diagram for describing operations of the impedance calibration circuit of FIG. 3 and the pass/fail detection circuit of FIG. 4.

Referring to FIGS. 2, 3, 4 and 5, the impedance calibration circuit 300 may perform the impedance calibration operation during an impedance calibration period TCAL. For example, when the impedance calibration enable signal ZQEN is activated based on the impedance calibration command CCMD, the impedance calibration period TCAL may begin, and the pull-up impedance calibration operation and the pull-down impedance calibration operation may be performed during the impedance calibration period TCAL. If the pull-up impedance calibration operation and the pull-down impedance calibration operation are normally completed, each of the pull-up voltage VPUZQ and the pull-down voltage VPDZQ may have a level that is near to the reference voltage VREF.

Pass/fail detection circuit 400 may perform the impedance calibration verifying operation during a verifying period TVR. For example, when the verification enable signal EDEN is activated based on the data read command RCMD (e.g., the example in FIG. 1), or when the verification enable signal EDEN is activated based on the impedance calibration command CCMD after the impedance calibration enable signal ZQEN is activated (e.g., an example in FIG. 12), the verifying period TVR may begin, and the first verifying operation and the second verifying operation may be performed during the verifying period TVR. As illustrated in FIG. 5, if both the level of the pull-up voltage VPUZQ and the level of the pull-down voltage VPDZQ are between the level of the first reference voltage VREFH and the level of the second reference voltage VREFL, (i.e., within the impedance calibration range), then the pass/fail detection circuit 400 may determine that both the pull-up impedance calibration operation and the pull-down impedance calibration operation are normally performed.

Although not illustrated in FIG. 5, if at least one selected from the level of the pull-up voltage VPUZQ and the level of the pull-down voltage VPDZQ is greater than the level of the pull-up voltage VPUZQ or is less than the level of the pull-down voltage VPDZQ, the pass/fail detection circuit 400 may determine that at least one selected from the pull-up impedance calibration operation and the pull-down impedance calibration operation is abnormally performed.

Figure 6:
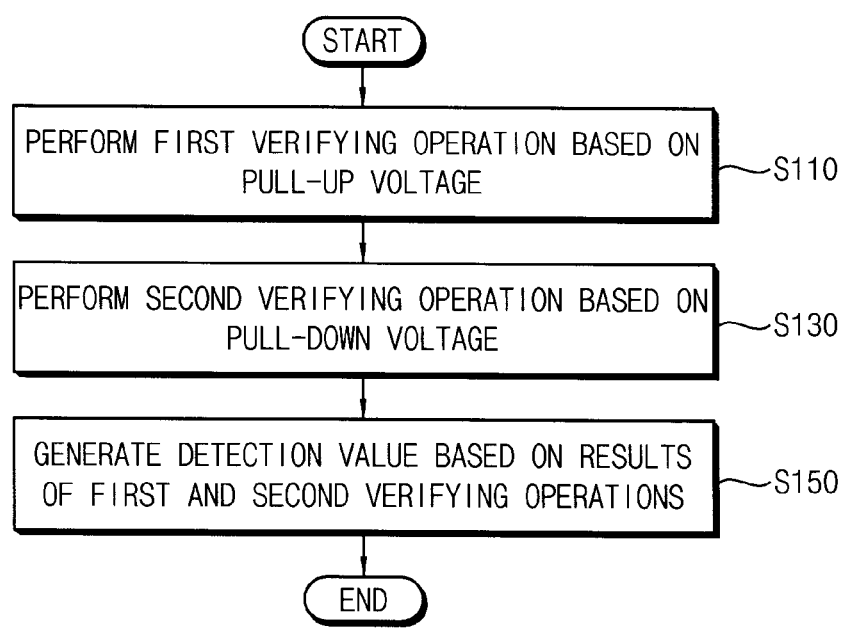
FIG. 6 is a flow chart illustrating an example method of performing an impedance calibration verifying operation in the method of FIG. 1.

FIG. 6 is a flow chart illustrating an example of performing an impedance calibration verifying operation in FIG. 1.

Referring to FIGS. 1, 2, 4 and 6, in the step of performing the impedance calibration verifying operation (e.g., in the step S100 in FIG. 1), the first verifying operation may be performed based on the pull-up voltage VPUZQ (step S110). The second verifying operation may be performed based on the pull-down voltage VPDZQ (step S130). The detection value DV may be generated based on results of the first and second verifying operations (step S150).

For example, when nonvolatile memory device 10 receives the data read command RCMD, control circuit 100 may activate the verification enable signal EDEN based on the data read command RCMD. The pass/fail detection circuit 400 may perform the first and second verifying operations based on the activated verification enable signal EDEN and may generate the first and second detection signals EDPU and EDPD as the results of the first and second verifying operations. The detection value DV that indicates the result of the impedance calibration verifying operation may be generated based on the first and second detection signals EDPU and EDPD. Storage unit 500 may store the detection value DV.

As described above with reference to FIG. 2, when nonvolatile memory device 10 receives the data read command RCMD and receives the first command CMD1 after the data read command RCMD is received, control circuit 100 may activate the output enable signal OEN based on the first command CMD1. Storage unit 500 may output the detection value DV based on the activated output enable signal OEN. For example, the detection value DV may be output through data I/O buffer 600 and the data I/O terminal 601.

Figure 7:
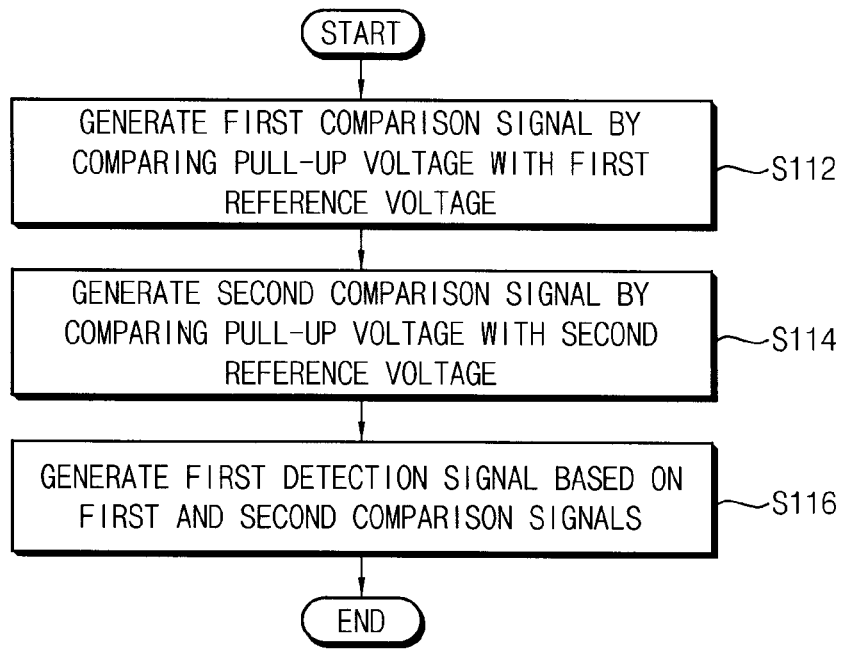
FIG. 7 is a flow chat illustrating an example method of performing a first verifying operation in the method of FIG. 6.
Figure 8:
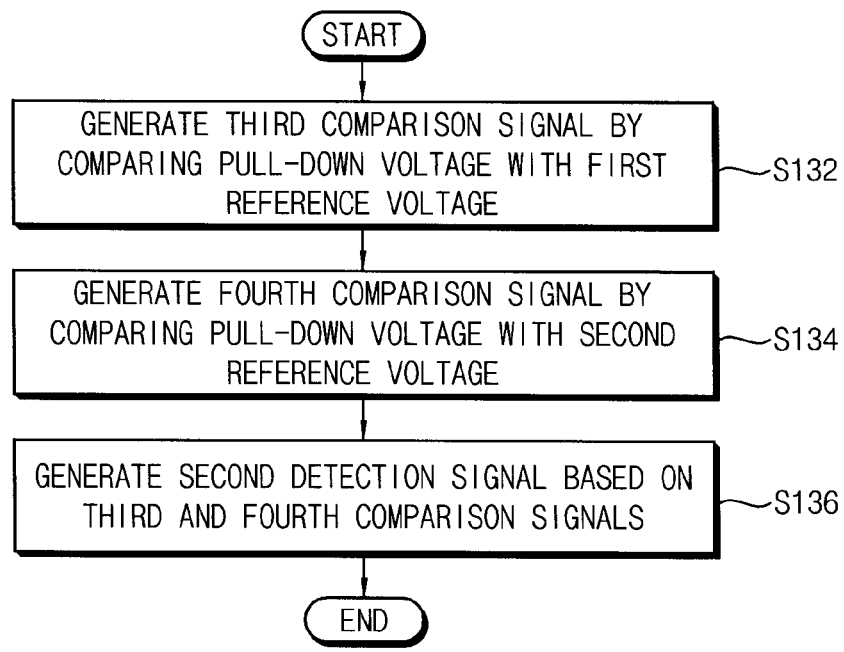
FIG. 8 is a flow chat illustrating an example method of performing a second verifying operation in the method of FIG. 6.

FIG. 7 is a flow chat illustrating an example method of performing a first verifying operation in FIG. 6. FIG. 8 is a flow chat illustrating an example of performing a second verifying operation in FIG. 6.

Referring to FIGS. 4, 6 and 7, in the step of performing the first verifying operation (e.g., in the step S110 in FIG. 6), the first comparison signal CS1 may be generated by comparing the pull-up voltage VPUZQ with the first reference voltage VREFH based on the activated verification enable signal EDEN (step S112). The second comparison signal CS2 may be generated by comparing the pull-up voltage VPUZQ with the second reference voltage VREFL based on the activated verification enable signal EDEN (step S114). The first detection signal EDPU may be generated based on the verification enable signal EDEN and the first and second comparison signals CS1 and CS2 (step S116). For example, the step S112 may be performed by the first comparison unit 412, the step S114 may be performed by the second comparison unit 414, and the step S116 may be performed by the first detection signal generation unit 420.

Referring to FIGS. 4, 6 and 8, in the step of performing the second verifying operation (e.g., in the step S130 in FIG. 6), the third comparison signal CS3 may be generated by comparing the pull-down voltage VPDZQ with the first reference voltage VREFH based on the activated verification enable signal EDEN (step S132). The fourth comparison signal CS4 may be generated by comparing the pull-down voltage VPDZQ with the second reference voltage VREFL based on the activated verification enable signal EDEN (step S134). The second detection signal EDPD may be generated based on the verification enable signal EDEN and the third and fourth comparison signals CS3 and CS4 (step S136). For example, the step S132 may be performed by third comparison unit 432, step S134 may be performed by fourth comparison unit 434, and step S136 may be performed by second detection signal generation unit 440.

Figure 9A:
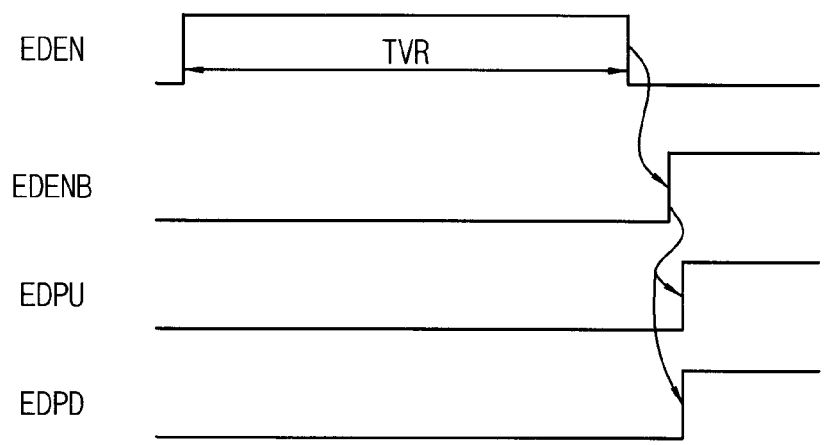
FIGS. 9A and 9B are diagrams for describing the operation of the pass/fail detection circuit of FIG. 4 and an example of generating a detection value in FIG. 6.
Figure 9B:
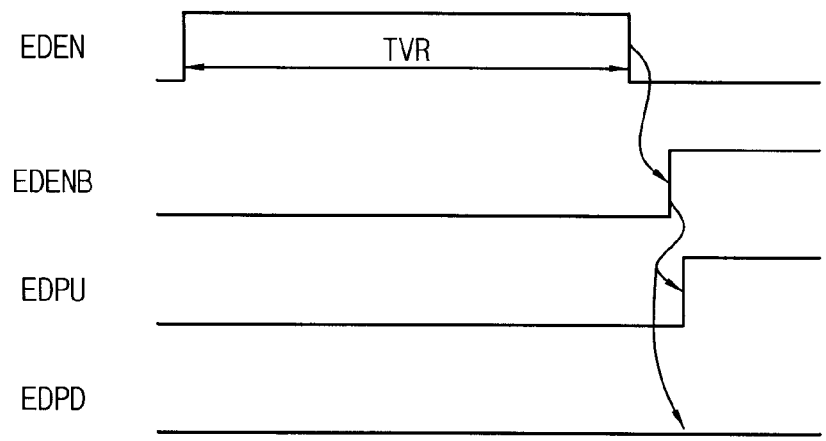

FIGS. 9A and 9B are diagrams for describing the operation of the pass/fail detection circuit of FIG. 4 and an example of generating a detection value in FIG. 6. FIG. 9A illustrates an example where the impedance calibration operation is normally performed. FIG. 9B illustrates an example where the impedance calibration operation is abnormally performed.

Referring to FIGS. 4, 6, 9A and 9B, the impedance calibration verifying operation may be performed during the verifying period TVR where the verification enable signal EDEN is activated. When the verification enable signal EDEN is deactivated after the impedance calibration verifying operation is performed, the inversion signal EDENB of the verification enable signal EDEN is activated, and then logic levels of the first and second detection signals EDPU and EDPD may be determined based on a rising edge of the inversion signal EDENB of the verification enable signal EDEN.

In the example illustrated in FIG. 9A, the impedance calibration operation may be normally performed, and thus, both the level of the pull-up voltage VPUZQ and the level of the pull-down voltage VPDZQ may be between the level of the first reference voltage VREFH and the level of the second reference voltage VREFL. In this case, the first through fourth comparison signals CS1, CS2, CS3 and CS4 may have logic high levels, respectively, and the outputs of the first and second AND gates 422 and 442 may also have the logic high levels, respectively. When the inversion signal EDENB of the verification enable signal EDEN is activated, the first and second detection signals EDPU and EDPD may have the logic high levels, respectively. Accordingly, the detection value DV, which is substantially the same as a first value (e.g., '0'), may be generated. The first value may indicate that the impedance calibration operation is normally performed.

In the example illustrated in FIG. 9B, the pull-up impedance calibration operation may be normally performed, however, the pull-down impedance calibration operation may be abnormally performed. Thus, the level of the pull-up voltage VPUZQ may be between the level of the first reference voltage VREFH and the level of the second reference voltage VREFL, and the level of the pull-down voltage VPDZQ may be greater than the level of the first reference voltage VREFH or may be less than the level of the second reference voltage VREFL. In this case, the first and second comparison signals CS1 and CS2 may have the logic high levels, respectively, and the output of first AND gate 422 may have the logic high level. In addition, one of the third and fourth comparison signals CS3 and CS4 may have a logic low level, and the output of second AND gate 442 may have the logic low level. When the inversion signal EDENB of the verification enable signal EDEN is activated, the first detection signal EDPU may have the logic high level, and the second detection signal EDPD may have the logic low level. Accordingly, the detection value DV, which is substantially the same as a second value (e.g., '1'), may be generated. The second value may indicate that the impedance calibration operation is abnormally performed.

Although not illustrated in FIGS. 9A and 9B, when the pull-down impedance calibration operation is normally performed, however, the pull-up impedance calibration operation is abnormally performed (e.g., when the level of the pull-down voltage VPDZQ is between the level of the first reference voltage VREFH and the level of the second reference voltage VREFL, and the level of the pull-up voltage VPUZQ is greater than the level of the first reference voltage VREFH or is less than the level of the second reference voltage VREFL), or when both the pull-up impedance calibration operation and the pull-down impedance calibration operation are abnormally performed (e.g., when both the level of the pull-up voltage VPUZQ and the level of the pull-down voltage VPDZQ are greater than the level of the first reference voltage VREFH or are less than the level of the second reference voltage VREFL), the detection value DV, which is substantially the same as the second value (e.g., '1'), may be generated.

Figure 10:
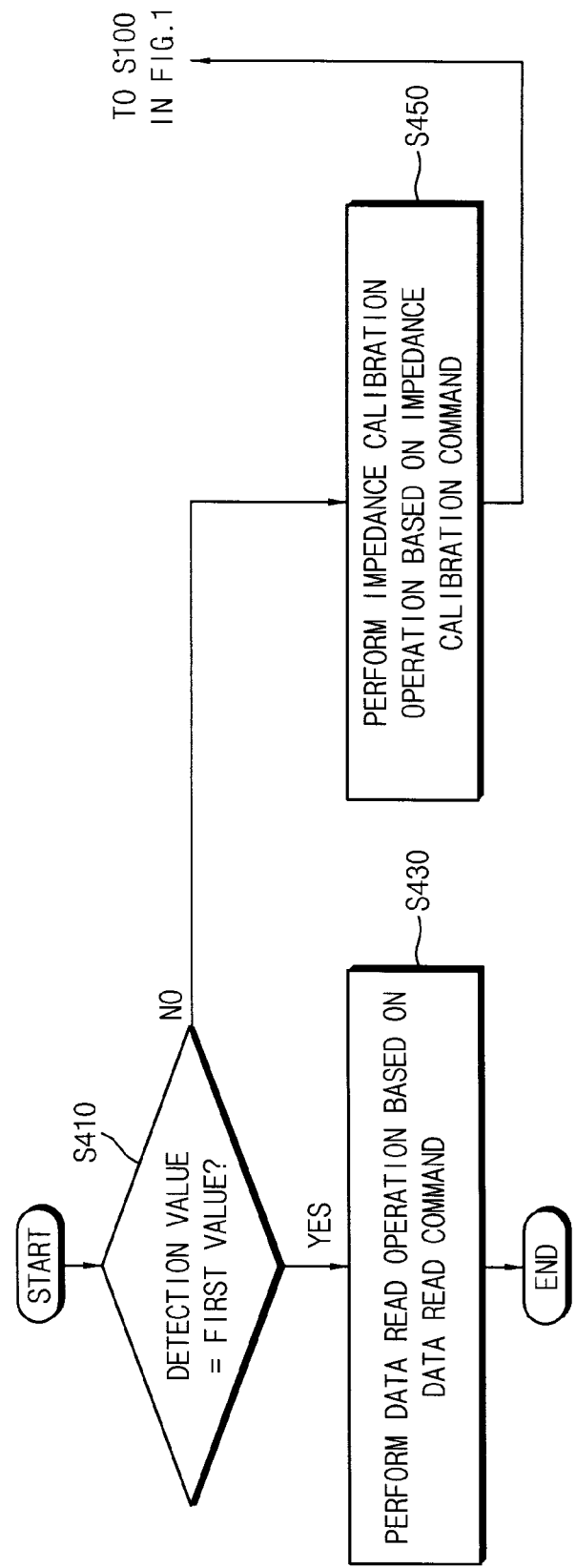
FIG. 10 is a flow chart illustrating an example method of selectively performing a data read operation or an impedance calibration operation in the method of FIG. 1.

FIG. 10 is a flow chart illustrating an example of selectively performing a data read operation or an impedance calibration operation in FIG. 1.

Referring to FIGS. 1, 2 and 10, in the step of selectively performing the data read operation or the impedance calibration operation (e.g., in step S400 in FIG. 1), it may be determined whether the detection value DV is substantially the same as the first value (e.g., '0') or the second value (e.g., '1') (step S410). For example, the detection value DV may be output through data I/O terminal 601, and the external memory controller (e.g., element 810 in FIG. 15) may determine whether the detection value DV is substantially the same as the first value or the second value. The first value may indicate that the impedance calibration operation is normally performed, and the second value may indicate that the impedance calibration operation is abnormally performed.

When the detection value DV is substantially the same as the first value (step S410: YES), the data read operation may be performed based on the data read command RCMD (step S430). For example, the data read command RCMD may be received from the external memory controller. Control circuit 100 may activate the read control signal RCON based on the data read command RCMD. Memory core 200 may output the read data based on the activated read control signal RCON and may provide the read data to the external memory controller.

When the detection value DV is substantially the same as the second value (step S410: NO), the impedance calibration operation may be performed based on the impedance calibration command CCMD (step S450). For example, the impedance calibration command CCMD may be received from the external memory controller. The control circuit 100 may activate the impedance calibration enable signal ZQEN based on the impedance calibration command CCMD. Impedance calibration circuit 300 may perform the impedance calibration operation based on the activated impedance calibration enable signal ZQEN.

In some example embodiments, steps S100, S200, S300 and S400 in FIG. 1 may be repeated after step S450 in FIG. 10 is performed. In this case, when step S100 is repeated, the impedance calibration verifying operation may be performed without receiving the data read command RCMD.

Figure 11:
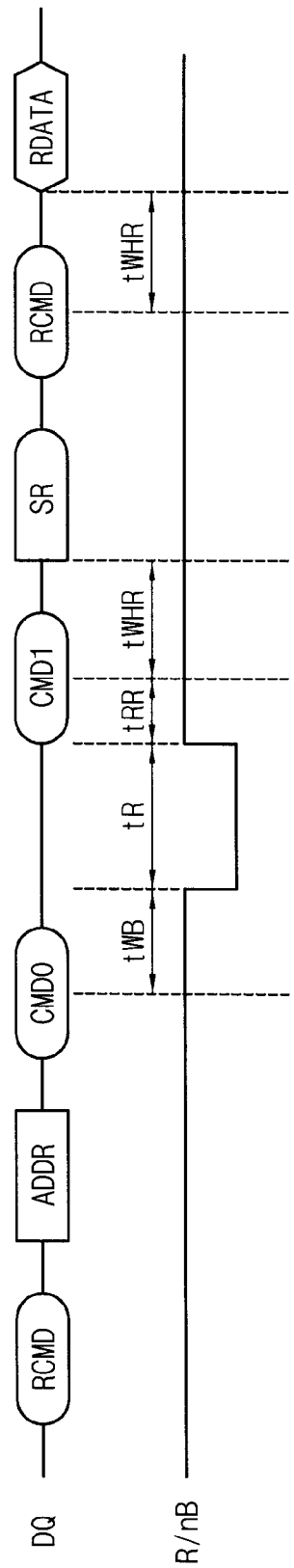
FIG. 11 is a diagram for describing the method of FIG. 1.

FIG. 11 is a diagram for describing the method of FIG. 1. In FIG. 11, DQ indicates generations of data and/or addresses based on commands, and R/nB indicates a signal (e.g., a ready/busy signal) that represents a status (e.g., a ready status or a busy status) of nonvolatile memory device 10.

Referring to FIGS. 1, 2 and 11, when the nonvolatile memory device 10 receives the data read command RCMD (e.g., '00h'), an address ADDR for the data read operation may be provided to memory core 200. When the nonvolatile memory device 10 receives a command CMD0 (e.g., '20h,' '30h,' '40h,' or '50h') after the data read command RCMD is received, read data RDATA corresponding to the address ADDR may be transferred from a memory cell array in memory core 200 to a peripheral region (e.g., a page buffer) in memory core 200. When nonvolatile memory device 10 receives the first command CMD1 after the command CMD0 is received, a status read value SR (e.g., the detection value DV) stored in storage unit 500 (e.g., the status register) may be output. When nonvolatile memory device 10 receives the data read command RCMD (e.g., '00h') after the first command CMD1 is received, the read data RDATA may be output.

In the method of operating the nonvolatile memory device according to example embodiments, the impedance calibration verifying operation may be performed during any period between a first time at which the data read command RCMD is received and a second time at which the first command CMD1 is received. The status read value SR that is output after the first command CMD1 is received may correspond to the detection value DV that corresponds to the result of the impedance calibration verifying operation.

In some example embodiments, the impedance calibration verifying operation may be performed during a first period tR. The first period tR may indicate a period while the read data RDATA corresponding to the address ADDR is transferred from the memory cell array to the peripheral region. In other words, the impedance calibration verifying operation may be performed after nonvolatile memory device 10 receives the data read command RCMD and while nonvolatile memory device 10 has a busy status (e.g., while the ready/busy signal R/nB has the logic low level).

In other example embodiments, the impedance calibration verifying operation may be performed during a second period tRR. The second period tRR may indicate a period after the first period tR and before the nonvolatile memory device receives the first command CMD1. In other words, the impedance calibration verifying operation may be performed after nonvolatile memory device 10 receives the data read command RCMD, after a status of nonvolatile memory device 10 is changed from the busy status to a ready status and before nonvolatile memory device 10 receives the first command CMD1.

In still other example embodiments, the impedance calibration verifying operation may be performed during a third period. The third period may indicate a period after nonvolatile memory device 10 receives the data read command RCMD and before the nonvolatile memory device 10 has the busy status.

In FIG. 11, tWB indicates a period after the command CMD0 is received and before the nonvolatile memory device 10 has the busy status, and tWHR indicates a period after one of the commands CMD1 and RCMD is received and before one of the data SR and RDATA is output through the data I/O terminal 601.

Figure 12:
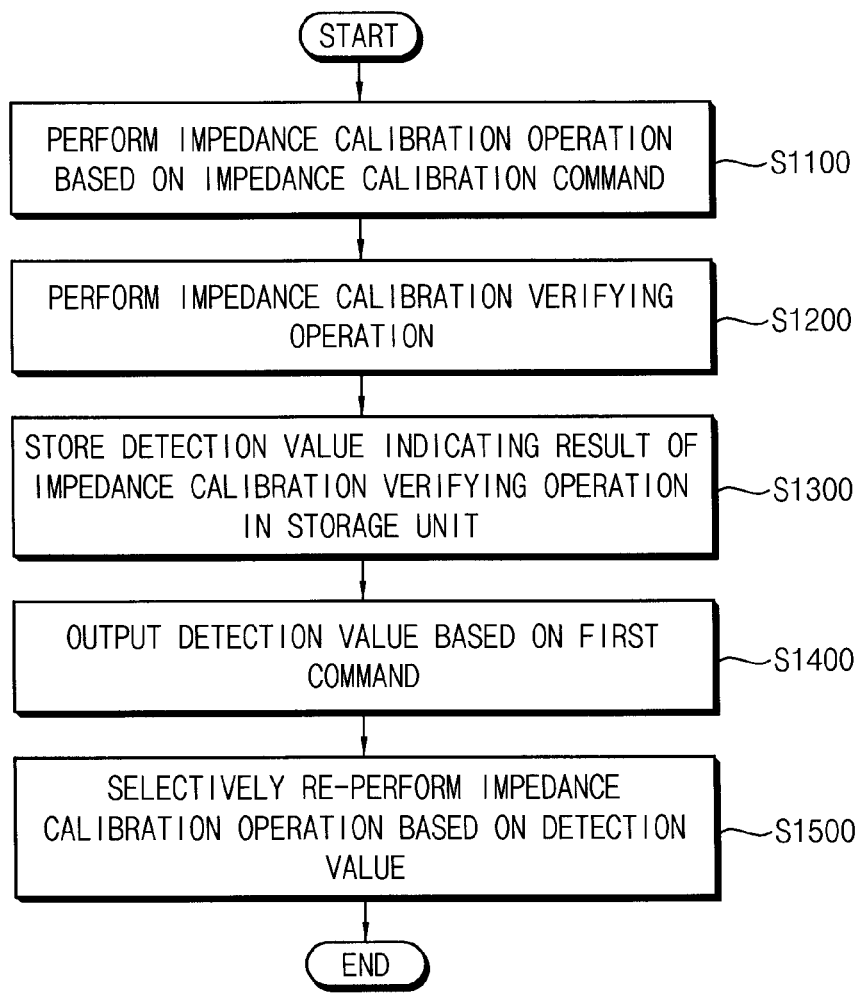
FIG. 12 is a flow chart illustrating a method of operating a nonvolatile memory device according to example embodiments.

FIG. 12 is a flow chart illustrating a method of operating a nonvolatile memory device according to example embodiments.

Referring to FIG. 12, in a method of operating a nonvolatile memory device according to example embodiments, an impedance calibration operation is performed based on an impedance calibration command (step S1100). The impedance calibration operation may be an operation for adjusting an output impedance and/or a termination impedance (e.g., an impedance at a data input/output (I/O) terminal) of the nonvolatile memory device. In the impedance calibration operation, the output impedance and/or the termination impedance may be adjusted by comparing the output impedance and/or the termination impedance with an impedance of an external resistor. The output impedance and/or the termination impedance may be fixed regardless of process, voltage and temperature (PVT) variations, based on the impedance calibration operation.

After the impedance calibration operation is performed, an impedance calibration verifying operation is performed (step S1200). It is determined whether an impedance calibration operation is normally performed on the data I/O terminal of the nonvolatile memory device based on the impedance calibration verifying operation. The step S1200 may be similar to the step S100 in FIG. 1.

A detection value is stored in a storage unit (step S1300). The detection value indicates a result of the impedance calibration verifying operation. After the detection value is stored in the storage unit, the detection value is output from the storage unit based on a first command (step S1400). The first command is received after the nonvolatile memory device receives the impedance calibration command. Steps S1300 and S1400 may be similar to steps S200 and S300 in FIG. 1, respectively.

The impedance calibration operation is selectively re-performed based on the detection value (step S1500). For example, an operation of the nonvolatile memory device associated with the impedance calibration operation may be terminated when it is determined, based on the detection value, that the impedance calibration operation is normally performed. The impedance calibration operation may be re-performed when it is determined, based on the detection value, that the impedance calibration operation is abnormally performed. Detailed examples of step S1500 will be described with reference to FIG. 14.

In the method of operating the nonvolatile memory device according to example embodiments, the impedance calibration verifying operation may be efficiently performed. For example, the impedance calibration verifying operation may be performed after the impedance calibration operation, and then the impedance calibration operation may be selectively re-performed based on the result of the impedance calibration verifying operation. Accordingly, a command overhead of the nonvolatile memory device may be reduced and a data throughput of the nonvolatile memory device may be improved.

Figure 13:
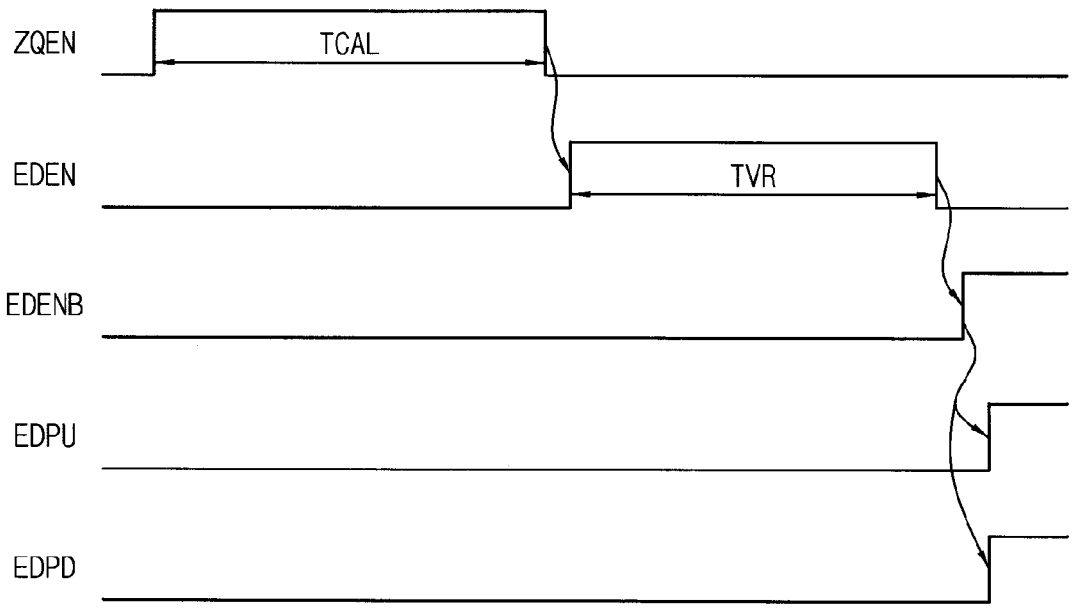
FIG. 13 is a diagram for describing the method of FIG. 12.

FIG. 13 is a diagram for describing the method of FIG. 12.

Referring to FIGS. 2, 4, 12 and 13, the impedance calibration operation may be performed during the impedance calibration period TCAL. For example, when the impedance calibration command CCMD (e.g., F9h or D9h) is received, the control circuit 100 may activate the impedance calibration enable signal ZQEN based on the impedance calibration command CCMD, and the impedance calibration period TCAL may begin. The impedance calibration circuit 300 may perform the pull-up impedance calibration operation and the pull-down impedance calibration operation during the impedance calibration period TCAL, as described above with reference to FIG. 2.

The impedance calibration verifying operation may be performed during the verifying period TVR. For example, after the impedance calibration operation is performed, control circuit 100 may activate the verification enable signal EDEN, and the verifying period TVR may begin. The pass/fail detection circuit 400 may perform the first verifying operation and the second verifying operation during the verifying period TVR, as described above with reference to FIGS. 4, 6, 7 and 8.

When the verification enable signal EDEN is deactivated after the impedance calibration verifying operation is performed, the inversion signal EDENB of the verification enable signal EDEN is activated, and then logic levels of the first and second detection signals EDPU and EDPD may be determined based on a rising edge of the inversion signal EDENB of the verification enable signal EDEN. In the example illustrated in FIG. 13, the impedance calibration operation may be normally performed, and thus, both the level of the pull-up voltage VPUZQ and the level of the pull-down voltage VPDZQ may be between the level of the first reference voltage VREFH and the level of the second reference voltage VREFL. In this case, the first and second detection signals EDPU and EDPD may have the logic high levels, respectively. Accordingly, the detection value DV, which is substantially the same as the first value (e.g., '0'), may be generated. The detection value DV may be stored in storage unit 500. When the first command CMD1 (e.g., 70h) is received, the detection value DV may be output.

Although not illustrated in FIG. 13, when at least one selected from the pull-down impedance calibration operation and the pull-up impedance calibration operation is abnormally performed, at least one selected from the level of the pull-up voltage VPUZQ and the level of the pull-down voltage VPDZQ may be higher than the level of the first reference voltage VREFH or may be lower than the level of the second reference voltage VREFL, at least one selected from the first and second detection signals EDPU and EDPD may have the logic low level, and thus the detection value DV, which is substantially the same as the second value (e.g., '1'), may be generated.

Figure 14:
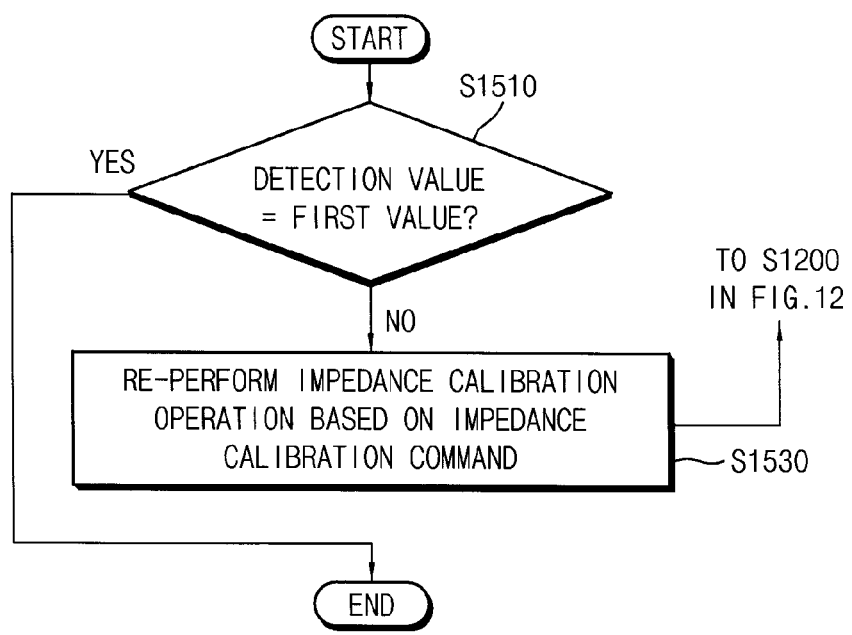
FIG. 14 is a flow chart illustrating an example method of selectively re-performing an impedance calibration operation in the method of FIG. 12.

FIG. 14 is a flow chart illustrating an example of selectively re-performing an impedance calibration operation in FIG. 12.

Referring to FIGS. 2, 12 and 14, in the step of selectively re-performing the impedance calibration operation (e.g., in step S1500 in FIG. 12), it may be determined whether the detection value DV is substantially the same as the first value (e.g., '0') or the second value (e.g., '1') (step S1510). For example, the detection value DV may be output through data I/O terminal 601, and the external memory controller (e.g., element 810 in FIG. 15) may determine whether the detection value DV is substantially the same as the first value or the second value. The first value may indicate that the impedance calibration operation is normally performed, and the second value may indicate that the impedance calibration operation is abnormally performed.

When the detection value DV is substantially the same as the first value (step S1510: YES), the impedance calibration operation may not be required, and thus the operation of nonvolatile memory device 10 associated with the impedance calibration operation may be terminated.

When the detection value DV is substantially the same as the second value (step S1510: NO), the impedance calibration operation may be re-performed based on the impedance calibration command CCMD (step S1530). For example, the impedance calibration command CCMD may be received from the external memory controller. Control circuit 100 may re-activate the impedance calibration enable signal ZQEN based on the impedance calibration command CCMD. The impedance calibration circuit 300 may re-perform the impedance calibration operation based on the activated impedance calibration enable signal ZQEN.

In some example embodiments, steps S1200, S1300, S1400 and S1500 in FIG. 12 may be repeated after step S1530 in FIG. 14 is performed.

Figure 15:
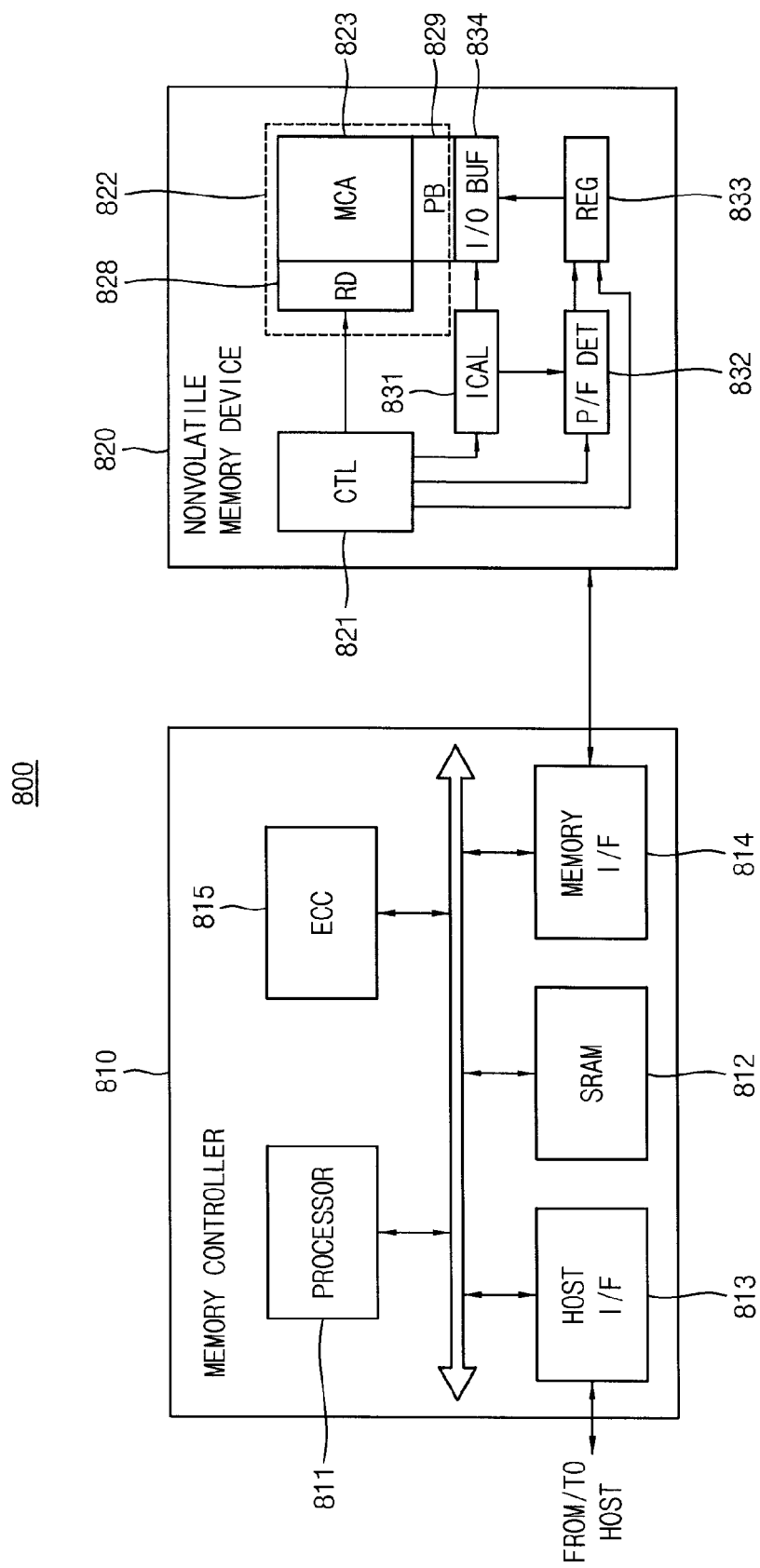
FIG. 15 is a block diagram illustrating a memory system including the nonvolatile memory device according to example embodiments.

FIG. 15 is a block diagram illustrating a memory system 800 including the nonvolatile memory device according to example embodiments.

Referring to FIG. 15, memory system 800 includes a memory controller 810 and a nonvolatile memory device 820.

Nonvolatile memory device 820 may include a control circuit 821, a memory core 822, an impedance calibration circuit 831, a pass/fail detection circuit 832, a storage unit 833 and a data I/O buffer 834.

Control circuit 821, memory core 822, impedance calibration circuit 831, pass/fail detection circuit 832, storage unit 833 and data I/O buffer 834 in FIG. 15 may be substantially the same as control circuit 100, memory core 200, impedance calibration circuit 300, pass/fail detection circuit 400, storage unit 500 and data I/O buffer 600 in FIG. 2, respectively.

Memory core 822 may perform the data read operation, the data write operation, the data erase operation, etc. Memory core 822 may include a memory cell array 823, a row decoder 828 and a page buffer 829.

Memory cell array 823 may include a plurality of memory cells that store data. Each of the plurality of memory cells may be connected to a respective one of a plurality of wordlines and a respective one of a plurality of bitlines. As will be described below with reference to FIGS. 16A, 16B and 16C, the plurality of memory cells may be NAND or NOR flash memory cells, and may be arranged in a two dimensional (2-D) array structure or a three dimensional (3-D) vertical array structure.

According to example embodiments, the plurality of memory cells may include multi-level memory cells (MLCs) in which more than two bits are stored in each of memory cells and/or single-level memory cells (SLCs) in which only one bit is stored in each of memory cells. In case of the MLC, a program scheme in the data write operation may include various program schemes such as a shadow program scheme, a reprogram scheme, an on-chip buffered program scheme, or the like.

Row decoder 828 may be connected to the plurality of wordlines, and may select at least one of the plurality of wordlines in response to a row address.

Page buffer circuit 829 may be connected to the plurality of bitlines, and may store write data to be programmed into memory cell array 823 or read data that are sensed from memory cell array 823. In other words, page buffer circuit 829 may operate as a write driver or a sensing amplifier according to an operation mode of nonvolatile memory device 820. For example, page buffer circuit 829 may operate as the write driver in a program mode, in which the data write operation is performed, and may operate as the sensing amplifier in a read mode, in which the data read operation is performed.

Impedance calibration circuit 831 may perform the impedance calibration operation. Pass/fail detection circuit 832 may perform the impedance calibration verifying operation. Storage unit 833 may store the detection value corresponding to the result of the impedance calibration verifying operation. Data I/O buffer 834 may receive write data to be programmed in memory cell array 823 from memory controller 810, and may transmit read data output from memory cell array 823 to memory controller 810. In addition, data I/O buffer 834 may output the detection value.

Control circuit 821 may control memory core 822 and data I/O buffer 834 to perform the data read operation, the data write operation and the data erase operation for memory cell array 823. Control circuit 821 may control impedance calibration circuit 831, pass/fail detection circuit 832 and storage unit 833 to perform the impedance calibration operation and the impedance calibration verifying operation for nonvolatile memory device 820.

Nonvolatile memory device 820 may efficiently perform the impedance calibration verifying operation. For example, the impedance calibration verifying operation may be performed before the data read operation, and then the data read operation or the impedance calibration operation may be selectively performed based on the result of the impedance calibration verifying operation. For another example, the impedance calibration verifying operation may be performed after the impedance calibration operation, and then the impedance calibration operation may be selectively re-performed based on the result of the impedance calibration verifying operation. Accordingly, a command overhead of nonvolatile memory device 820 may be reduced and a data throughput of nonvolatile memory device 820 may be improved.

Memory controller 810 may control nonvolatile memory device 820. Memory controller 810 may control data transfer between an external host (not illustrated) and nonvolatile memory device 820. Memory controller 810 may include a processor 811, such as a central processing unit (CPU), a buffer memory 812, a host interface 813, a memory interface 814 and an error checking & correction (ECC) block 815.

Processor 811 may perform operations for the data transfer. In some example embodiments, buffer memory 812 may be implemented by a static random access memory (SRAM). In other example embodiments, buffer memory 812 may be implemented by a dynamic random access memory (DRAM), a PRAM, a FRAM, a RRAM, a MRAM, etc. According to example embodiments, buffer memory 812 may be located internal or external to memory controller 810.

Host interface 813 may be connected to the host, and memory interface 814 may be connected to nonvolatile memory device 820. Processor 811 may communicate with the host via host interface 813. For example, host interface 813 may be configured to communicate with the host using at least one of various interface protocols, such as a universal serial bus (USB), a multi-media card (MMC), a peripheral component interconnect-express (PCI-E), a small computer system interface (SCSI), a serial-attached SCSI (SAS), a serial advanced technology attachment (SATA), a parallel advanced technology attachment (PATA), an enhanced small disk interface (ESDI), integrated drive electronics (IDE), etc. Further, processor 811 may communicate with nonvolatile memory device 820 via memory interface 814.

In some example embodiments, ECC block 815 may perform ECC encoding and ECC decoding by using a Bose-Chaudhuri-Hocquenghem (BCH) code. In other example embodiments, ECC block 815 may perform the ECC encoding and the ECC decoding by using a low density parity check (LDPC) code. In still other example embodiments, ECC block 815 may perform the ECC encoding and the ECC decoding by using a turbo code, a Reed-Solomon code, a convolution code, a recursive systematic code (RSC), a coded modulation, such as a trellis-coded modulation (TCM), a block coded modulation (BCM), etc., or other error correction codes.

According to example embodiments, memory controller 810 may be incorporated in nonvolatile memory device 820, or memory controller 810 and nonvolatile memory device 820 may be implemented as separate chips.

Memory system 800 may be implemented as a memory card, a solid state drive, etc. In some example embodiments, nonvolatile memory device 820, memory controller 810 and/or memory system 800 may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi chip package (MCP), wafer-level fabricated package (WFP), or wafer-level processed stack package (WSP).

Figure 16A:
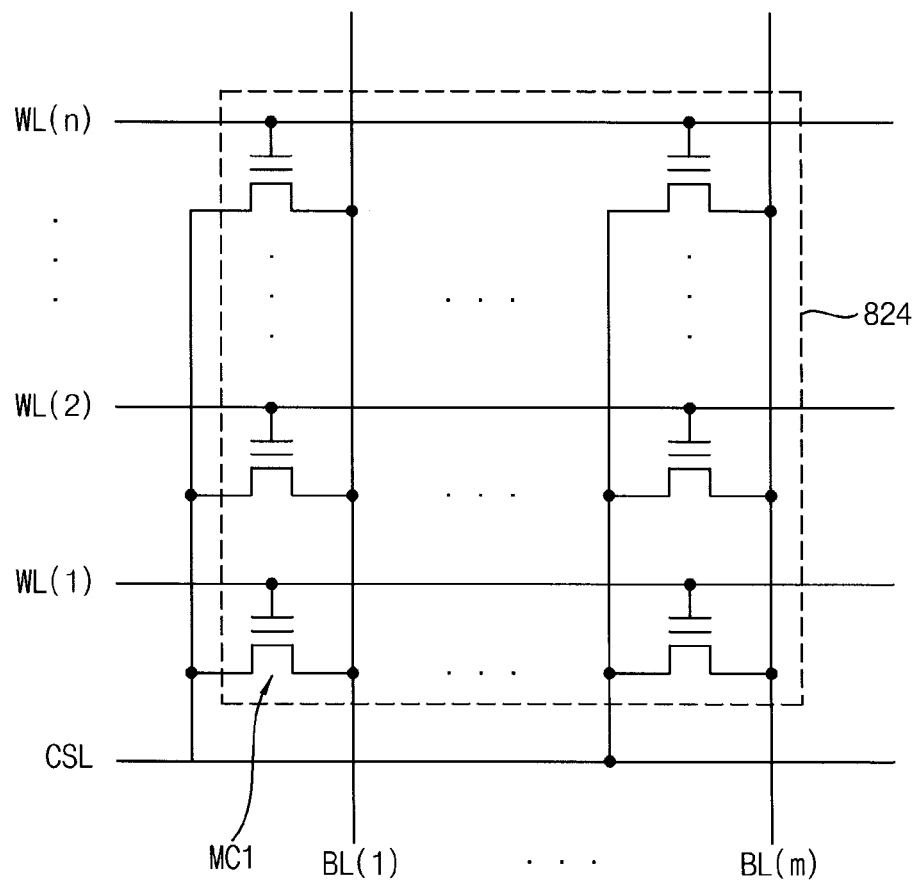
FIGS. 16A, 16B and 16C are diagrams illustrating examples of a memory cell array included in the nonvolatile memory device in FIG. 15.
Figure 16B:
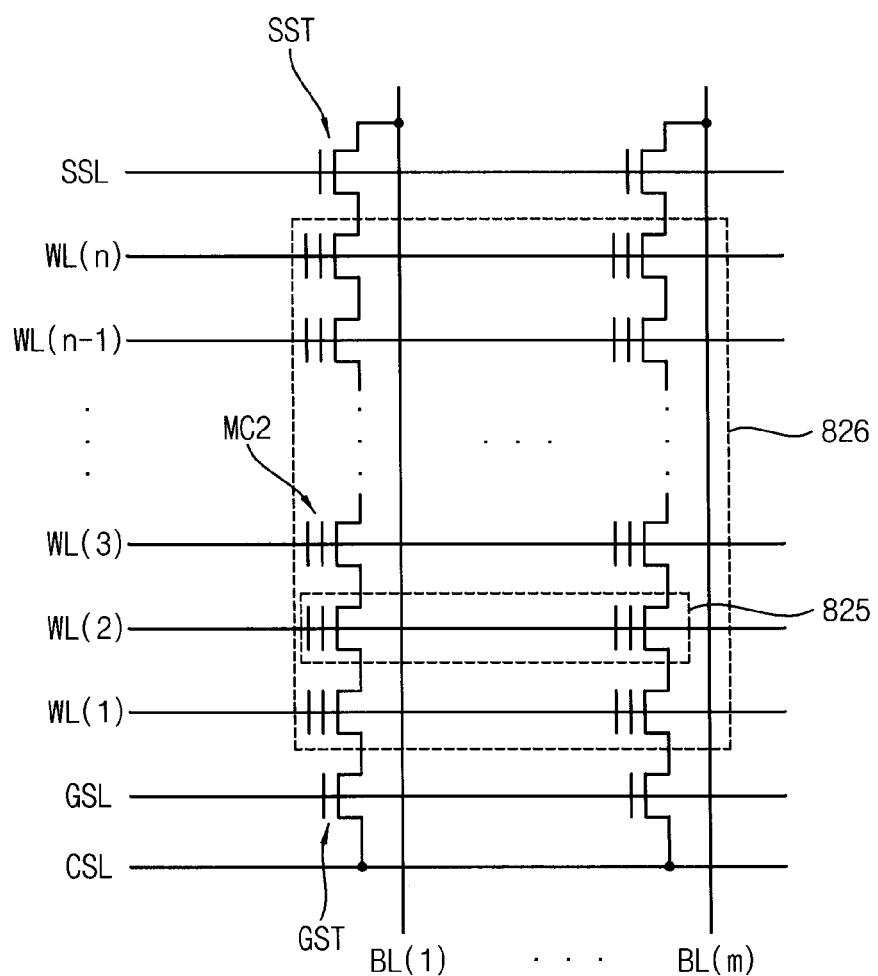
Figure 16C:
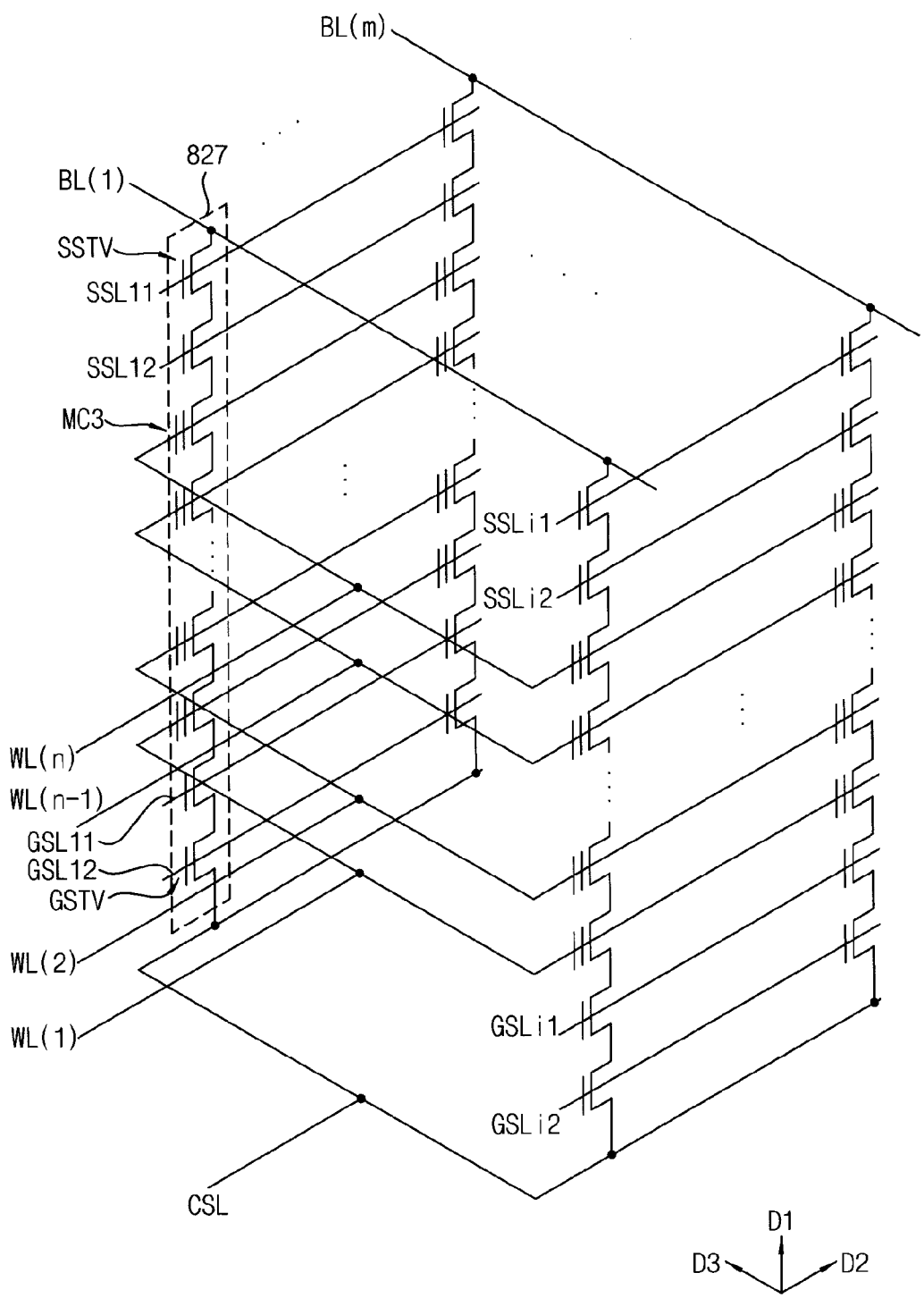

FIGS. 16A, 16B and 16C are diagrams illustrating examples of a memory cell array included in the nonvolatile memory device in FIG. 15.

FIG. 16A is a circuit diagram illustrating an example of a memory cell array included in a NOR flash memory device. FIG. 16B is a circuit diagram illustrating an example of a memory cell array included in a NAND flash memory device. FIG. 16C is a circuit diagram illustrating an example of a memory cell array included in a vertical flash memory device.

Referring to FIG. 16A, a memory cell array 823a may include a plurality of memory cells MC1. The memory cells arranged in the same row may be disposed in parallel between one of bitlines BL(1), . . . , BL(m) and a common source line CSL, and may be connected in common to one of wordlines WL(1), WL(2), . . . , WL(n). For example, the memory cells arranged in a first row may be disposed in parallel between a first bitline BL(1) and the common source line CSL. Gate electrodes of the memory cells arranged in the first row may be coupled in common to a first wordline WL(1). The memory cells MC1 may be controlled according to levels of voltages applied to the wordlines WL(1), . . . , WL(n). The NOR flash memory device including the memory cell array 823a may perform write and read operations in units of byte or word, and may perform an erase operation in units of block 824.

Referring to FIG. 16B, a memory cell array 823b may include string selection transistors SST, ground selection transistors GST and memory cells MC2. The string selection transistors SST may be connected to the bitlines BL(1), . . . , BL(m), and the ground selection transistors GST may be connected to the common source line CSL. The memory cells arranged in the same row may be disposed in series between one of the bitlines BL(1), . . . , BL(m) and the common source line CSL, and the memory cells arranged in the same column may be connected in common to one of the wordlines WL(1), WL(2), WL(3), . . . , WL(n−1), WL(n). In other words, the memory cells MC2 may be connected in series between the string selection transistors SST and the ground selection transistors GST, and the 16, 32 or 64 word lines may be disposed between the string selection line SSL and the ground selection line GSL.

The string selection transistors SST are connected to the string selection line SSL such that the string selection transistors SST may be controlled according to a level of a voltage applied from the string selection line SSL. The memory cells MC2 may be controlled according to levels of voltages applied to the wordlines WL(1), . . . , WL(n).

The NAND flash memory device including memory cell array 823b may perform the data read and write operations in units of a page 825 and the data erase operation in units of a block 826. In some example embodiments, page buffers each may be connected to even and odd bitlines one by one. In this case, the even bitlines form an even page, the odd bitlines form an odd page, and the data write operation for the memory cells MC2 of the even and odd pages may be performed by turns and sequentially.

Referring to FIG. 16C, a memory cell array 823c may include a plurality of strings 827 having a vertical structure. The plurality of strings 827 may be formed in a second direction D2 such that a string row may be formed. A plurality of string rows may be formed in a third direction D3 such that a string array may be formed. Each of the strings 827 may include ground selection transistors GSTV, memory cells MC3 and string selection transistors SSTV which are disposed in series in a first direction D1 between the bitlines BL(1), . . . , BL(m) and the common source line CSL.

The ground selection transistors GSTV may be connected to the ground selection lines GSL11, GSL12, . . . , GSLi1, GSLi2, respectively, and the string selection transistors SSTV may be connected to the string selection lines SSL11, SSL12, . . . , SSLi1, SSLi2, respectively. The memory cells arranged on the same layer may be connected in common to one of the wordlines WL(1), WL(2), . . . , WL(n−1), WL(n). The ground selection lines GSL11, . . . , GSLi2 and the string selection lines SSL11, . . . , SSLi2 may extend in the second direction D2 and may be formed along the third direction D3. The wordlines WL(1), . . . , WL(n) may extend in the second direction D2 and may be formed along the first and third directions D1 and D3. The bitlines BL(1), . . . , BL(m) may extend in the third direction D3 and may be formed along the second direction D2. The memory cells MC3 may be controlled according to levels of voltages applied to the wordlines WL(1), . . . , WL(n).

Since the vertical flash memory device including the memory cell array 823c includes NAND flash memory cells, like the NAND flash memory device of FIG. 16B, the vertical flash memory device performs the data read and write operations in units of a page and the data erase operation in units of a block.

In some example embodiments, it may be implemented that two string selection transistors included in one string 827 are connected to one string selection line, and two ground selection transistors included in one string are connected to one ground selection line. In other example embodiments, it may be implemented that one string 827 includes one string selection transistor and one ground selection transistor.

Figure 17:
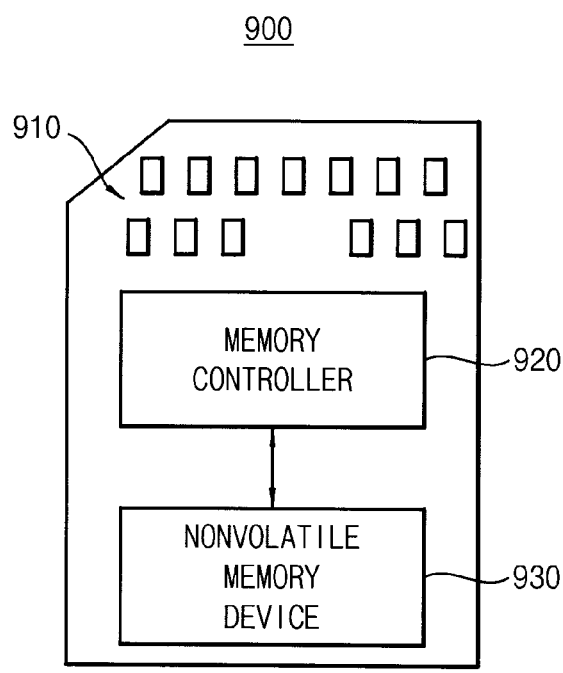
FIG. 17 is a diagram illustrating a memory card according to example embodiments.

FIG. 17 is a diagram illustrating a memory card according to example embodiments.

Referring to FIG. 17, a memory card 900 may include a plurality of connecting pins 910, a memory controller 920 and a nonvolatile memory device 930.

Connecting pins 910 may be connected to a host (not illustrated) to transfer signals between the host and memory card 900. Connecting pins 910 may include a clock pin, a command pin, a data pin and/or a reset pin.

Memory controller 920 may receive data from the host, and may store the received data in nonvolatile memory devices 930. Although not illustrated in FIG. 17, memory card 900 may further include at least one volatile memory device that temporarily stores data transferred between the host and nonvolatile memory devices 930.

Nonvolatile memory device 930 may efficiently perform the impedance calibration verifying operation. For example, the impedance calibration verifying operation may be performed before the data read operation, and then the data read operation or the impedance calibration operation may be selectively performed based on the result of the impedance calibration verifying operation. For another example, the impedance calibration verifying operation may be performed after the impedance calibration operation, and then the impedance calibration operation may be selectively re-performed based on the result of the impedance calibration verifying operation. Accordingly, a command overhead of nonvolatile memory device 930 may be reduced and a data throughput of nonvolatile memory device 930 may be improved.

For example, memory card 900 may include a multimedia card (MMC), an embedded multimedia card (eMMC), a hybrid embedded multimedia card (hybrid eMMC), a secure digital (SD) card, a micro-SD card, a memory stick, an ID card, a personal computer memory card international association (PCMCIA) card, a chip card, a universal serial bus (USB) card, a smart card, a compact flash (CF) card, etc.

In some example embodiments, memory card 900 may be attachable to the host, such as a desktop computer, a laptop computer, a tablet computer, a mobile phone, a smart phone, a music player, a personal digital assistants (PDA), a portable multimedia player (PMP), a digital television, a digital camera, a portable game console, etc.

Figure 18:
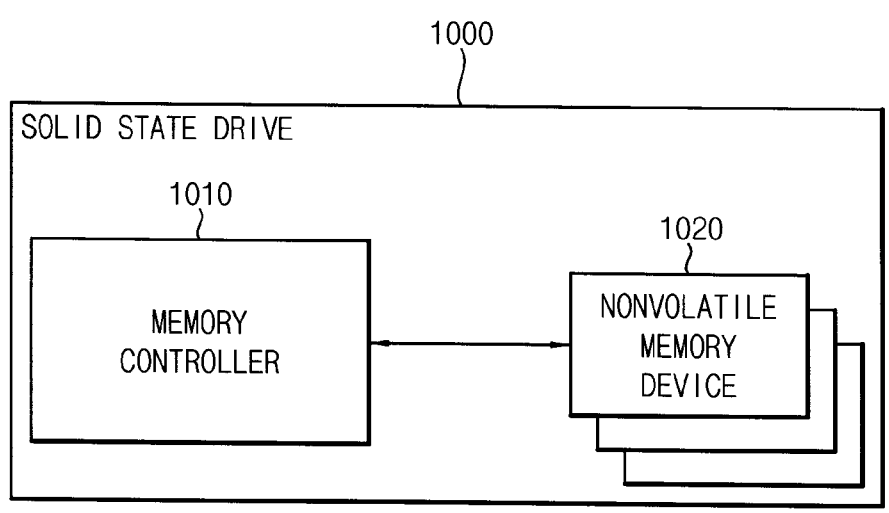
FIG. 18 is a diagram illustrating a solid state drive (SSD) according to example embodiments.

FIG. 18 is a diagram illustrating a solid state drive (SSD) 1000 according to example embodiments.

Referring to FIG. 18, SSD 1000 includes a memory controller 1010 and a plurality of nonvolatile memory devices 1020.

Memory controller 1010 may receive data from a host (not illustrated). Memory controller 1010 may store the received data in the plurality of nonvolatile memory devices 1020. Although not illustrated in FIG. 18, SSD 1000 may further include at least one volatile memory device that temporarily stores the received data.

Nonvolatile memory devices 1020 may efficiently perform the impedance calibration verifying operation. For example, the impedance calibration verifying operation may be performed before the data read operation, and then the data read operation or the impedance calibration operation may be selectively performed based on the result of the impedance calibration verifying operation. For another example, the impedance calibration verifying operation may be performed after the impedance calibration operation, and then the impedance calibration operation may be selectively re-performed based on the result of the impedance calibration verifying operation. Accordingly, command overheads of nonvolatile memory devices 1020 may be reduced and data throughputs of nonvolatile memory devices 1020 may be improved.

In some example embodiments, SSD 1000 may be connected to the host, such as a mobile device, a mobile phone, a smart phone, a PDA, a PMP, a digital camera, a portable game console, a music player, a desktop computer, a notebook computer, a tablet computer, a speaker, a video, a digital television, etc.

Figure 19:
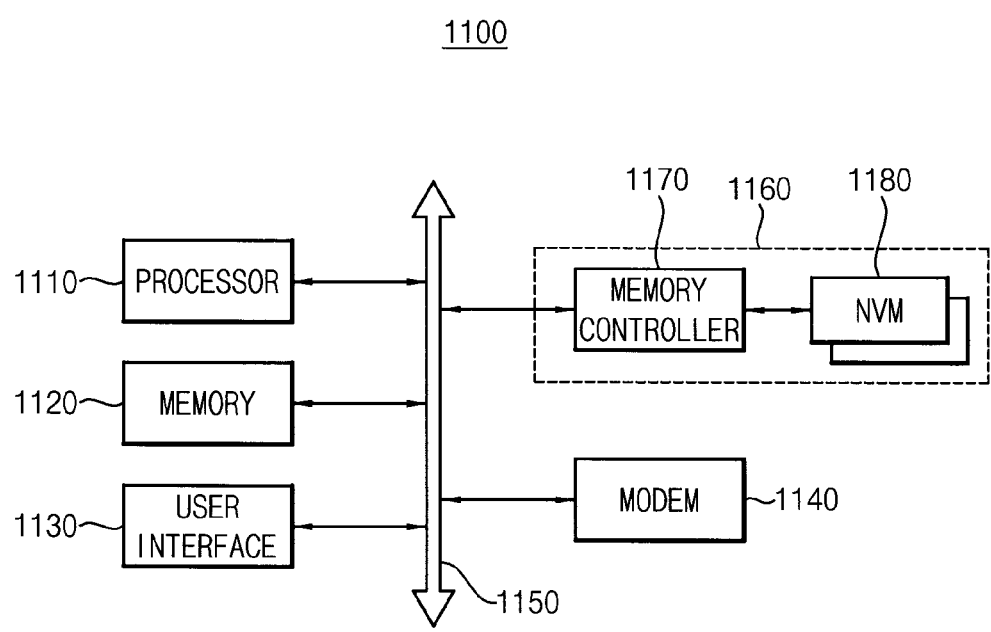
FIG. 19 is a diagram illustrating a computing system according to example embodiments.

FIG. 19 is a diagram illustrating a computing system 1100 according to example embodiments.

Referring to FIG. 19, computing system 1100 includes a processor 1110, a memory device 1120, a user interface 1130, a bus 1150 and a memory system 1160. In some example embodiments, computing system 1100 may further include a modem 1140, such as a baseband chipset.

Processor 1110 may perform specific calculations or tasks. For example, processor 1110 may be a microprocessor, a central processing unit (CPU), a digital signal processor, or the like. Processor 1110 may be coupled to memory device 1120 via a bus 1150, such as an address bus, a control bus and/or a data bus. For example, memory device 1120 may be implemented by a DRAM, a mobile DRAM, a SRAM, a PRAM, a FRAM, a RRAM, a MRAM and/or a flash memory. Further, processor 1110 may be connected to an extension bus, such as a peripheral component interconnect (PCI) bus, and may control user interface 1130 including at least one input device, such as a keyboard, a mouse, a touch screen, etc., and at least one output device, a printer, a display device, etc. Modem 1140 may perform wired or wireless communication with an external device.

Nonvolatile memory devices 1180 in memory system 1160 may be controlled by a memory controller 1170 to store data processed by processor 1110 or data received via modem 1140. Memory system 1160 may operate based on the method described above with reference to FIGS. 1 through 14. Accordingly, command overheads of nonvolatile memory devices 1180 may be reduced and data throughputs of nonvolatile memory devices 1180 may be improved.

In some example embodiments, computing system 1100 may further include a power supply, an application chipset, a camera image processor (CIS), etc.

The above described embodiments may be used in a nonvolatile memory device or a system including the nonvolatile memory device, such as a mobile phone, a smart phone, a PDA, a PMP, a digital camera, a digital television, a set-top box, a music player, a portable game console, a navigation device, a personal computer (PC), a server computer, a workstation, a tablet computer, a laptop computer, a smart card, a printer, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of operating a nonvolatile memory device, the method comprising:
   performing an impedance calibration verifying operation for a data input/output (I/O) terminal of the nonvolatile memory device based on one of a data read command and an impedance calibration command for the data I/O terminal of the nonvolatile memory device, wherein the impedance calibration verifying operation ascertains whether an impedance calibration operation is normally performed for the data I/O terminal of the nonvolatile memory device;
   producing a detection value indicating a result of the impedance calibration verifying operation; and
   selectively performing a data read operation or the impedance calibration operation based on the detection value.

2. The method of claim 1, wherein selectively performing the data read operation or the impedance calibration operation includes:
   performing the data read operation based on the data read command when the detection value is substantially the same as a first value, the first value indicating that the impedance calibration operation is normally performed; and
   performing the impedance calibration operation based on an impedance calibration command when the detection value is substantially the same as a second value, the second value indicating that the impedance calibration operation is abnormally performed.

3. The method of claim 2, wherein performing the impedance calibration verifying operation, and selectively performing the data read operation or the impedance calibration operation are repeated after the impedance calibration operation is performed based on the detection value and the second value.

4. The method of claim 1, further comprising outputting the detection value based on a first command received after the nonvolatile memory device receives the one of the data read command and the impedance calibration command.

5. The method of claim 4, wherein the detection value is output through the data I/O terminal of the nonvolatile memory device.

6. The method of claim 1, wherein the impedance calibration verifying operation is performed after the nonvolatile memory device receives the data read command and while the nonvolatile memory device has a busy status.

7. The method of claim 1, wherein the impedance calibration verifying operation is performed after the nonvolatile memory device receives the data read command, after a status of the nonvolatile memory device is changed from a busy status to a ready status and before the nonvolatile memory device receives the first command.

8. The method of claim 1, wherein the impedance calibration operation includes a pull-up impedance calibration operation and a pull-down impedance calibration operation,
wherein the impedance calibration verifying operation includes a first verifying operation for the pull-up impedance calibration operation and a second verifying operation for the pull-down impedance calibration operation.

9. The method of claim 1, wherein performing the impedance calibration verifying operation includes:
performing a first verifying operation based on a pull-up voltage that is output from an impedance calibration circuit included in the nonvolatile memory device;
performing a second verifying operation based on a pull-down voltage that is output from the impedance calibration circuit; and
generating the detection value based on results of the first and second verifying operations.

10. The method of claim 9, wherein performing the first verifying operation includes:
generating a first comparison signal by comparing the pull-up voltage with a first reference voltage;
generating a second comparison signal by comparing the pull-up voltage with a second reference voltage; and
generating a first detection signal based on the first and second comparison signals.

11. The method of claim 10, wherein performing the second verifying operation includes:
generating a third comparison signal by comparing the pull-down voltage with the first reference voltage;
generating a fourth comparison signal by comparing the pull-down voltage with the second reference voltage; and
generating a second detection signal based on the third and fourth comparison signals.

12. The method of claim 1, further comprising:
performing an impedance calibration operation for the data I/O terminal of the nonvolatile memory device in response to the impedance calibration command, prior to performing the impedance calibration verifying operation.

13. A nonvolatile memory device, comprising:
an impedance calibration circuit configured to perform an impedance calibration operation for a data input/output (I/O) terminal of the nonvolatile memory device based on an impedance calibration command;
a pass/fail detection circuit configured to perform an impedance calibration verifying operation based on a data read command or the impedance calibration command, wherein the impedance calibration verifying operation ascertains whether the impedance calibration operation is normally performed for the data I/O terminal of the nonvolatile memory device; and
a storage unit configured to store a detection value, the detection value indicating a result of the impedance calibration verifying operation, the detection value being output from the storage unit based on a first command received after the nonvolatile memory device receives the data read command or the impedance calibration command,
wherein the impedance calibration circuit is further configured to selectively perform the impedance calibration operation based on the detection value.

14. The nonvolatile memory device of claim 13, wherein the pass/fail detection circuit includes:
a first verification unit configured to generate a first detection signal based on a first reference voltage, a second reference voltage and a pull-up voltage output from the impedance calibration circuit; and
a second verification unit configured to generate a second detection signal based on the first reference voltage, the second reference voltage and a pull-down voltage output from the impedance calibration circuit,
wherein the detection value is stored in the storage unit based on the first and second detection signals.

15. The nonvolatile memory device of claim 14, wherein the first verification unit includes:
a first comparison unit configured to generate a first comparison signal by comparing the pull-up voltage with the first reference voltage based on a verification enable signal;
a second comparison unit configured to generate a second comparison signal by comparing the pull-up voltage with the second reference voltage based on the verification enable signal; and
a first detection signal generation unit configured to generate the first detection signal based on the verification enable signal and the first and second comparison signals.

16. The nonvolatile memory device of claim 15, wherein the second verification unit includes:
a third comparison unit configured to generate a third comparison signal by comparing the pull-down voltage with the first reference voltage based on the verification enable signal;
a fourth comparison unit configured to generate a fourth comparison signal by comparing the pull-down voltage with the second reference voltage based on the verification enable signal; and
a second detection signal generation unit configured to generate the second detection signal based on the verification enable signal and the third and fourth comparison signals.

17. The nonvolatile memory device of claim 15, wherein the pass/fail detection circuit further includes:
a reference voltage generation unit configured to generate the first and second reference voltages based on a power supply voltage, a ground voltage and the verification enable signal.

18. A method, comprising:
receiving at a memory device a read command for reading data from one or more memory cells of the memory device;
in response to the received read command, verifying whether an impedance calibration of a data input/output (I/O) terminal of the memory device is normal;

when the impedance calibration of the data I/O terminal of the memory device is verified to be normal, performing a data read operation without first performing an impedance calibration operation for the data I/O terminal; and when the impedance calibration of the data I/O terminal of the memory device is not verified to be normal, performing the impedance calibration operation for the data I/O terminal.

19. The method of claim 18, wherein verifying whether the impedance calibration of the data I/O terminal of the memory device is normal includes producing a detection value which indicates whether or not the impedance calibration of the data I/O terminal of the memory device is verified to be normal, the method further comprising outputting the detection value from the memory device via the data I/O terminal.

20. The method of claim 18, verifying whether the impedance calibration of the data I/O terminal of the memory device is normal includes ascertaining whether a pull-up voltage and a pull-down voltage of an impedance calibration circuit of the memory device are within an impedance calibration range.

* * * * *